(12) United States Patent
Iwasa et al.

(10) Patent No.: US 12,453,218 B2
(45) Date of Patent: Oct. 21, 2025

(54) LIGHT-EMITTING DEVICE

(71) Applicant: NICHIA CORPORATION, Anan (JP)

(72) Inventors: Makiko Iwasa, Anan (JP); Yuji Sato, Anan (JP)

(73) Assignee: NICHIA CORPORATION, Anan (JP)

( * ) Notice: Subject to any disclaimer, the term of this patent is extended or adjusted under 35 U.S.C. 154(b) by 421 days.

(21) Appl. No.: 17/907,354

(22) PCT Filed: Feb. 10, 2021

(86) PCT No.: PCT/JP2021/004900
§ 371 (c)(1),
(2) Date: Sep. 26, 2022

(87) PCT Pub. No.: WO2021/192681
PCT Pub. Date: Sep. 30, 2021

(65) Prior Publication Data
US 2023/0109952 A1    Apr. 13, 2023

(30) Foreign Application Priority Data
Mar. 27, 2020  (JP) ................. 2020-058695

(51) Int. Cl.
*H10H 20/851*  (2025.01)
*H05B 33/14*  (2006.01)
*H10H 20/01*  (2025.01)

(52) U.S. Cl.
CPC ......... *H10H 20/8513* (2025.01); *H05B 33/14* (2013.01); *H10H 20/0361* (2025.01)

(58) Field of Classification Search
None
See application file for complete search history.

(56) References Cited

U.S. PATENT DOCUMENTS

| | | |
|---|---|---|
| 8,530,250 B2 | 9/2013 | Ichikawa et al. |
| 9,276,180 B2 | 3/2016 | Ishida et al. |
| 9,287,476 B2 | 3/2016 | Ichikawa et al. |
| 9,349,664 B2 | 5/2016 | Ishida et al. |
| 9,490,411 B2 | 11/2016 | Ichikawa et al. |
| 9,537,071 B2 | 1/2017 | Ichikawa et al. |
| 10,115,870 B2 | 10/2018 | Ichikawa et al. |
| 10,121,941 B2 | 11/2018 | Iwakura et al. |
| 10,573,788 B2 | 2/2020 | Ichikawa et al. |
| 10,573,789 B2 | 2/2020 | Ichikawa et al. |

(Continued)

FOREIGN PATENT DOCUMENTS

| | | |
|---|---|---|
| JP | S57136743 A | 8/1982 |
| JP | 2004193581 A | 7/2004 |

(Continued)

*Primary Examiner* — Sarah K Salerno
(74) *Attorney, Agent, or Firm* — Hunton Andrews Kurth LLP

(57) ABSTRACT

Provided is a light-emitting device having a high luminous flux.
The light-emitting device comprises a light-emitting element 11 that has a dominant wavelength in a range of 380 nm or more and 485 nm or less, and a fluorescent material layer 31 that includes a fluorescent material emitting light by being excited by light emitted from the light-emitting element 11, and a neodymium compound, wherein the light-emitting device emits light having a dominant wavelength in a range of 584 nm or more and 780 nm or less.

5 Claims, 19 Drawing Sheets

(56) References Cited

U.S. PATENT DOCUMENTS

| | | | |
|---|---|---|---|
| 10,700,241 B2 | 6/2020 | Ichikawa et al. | |
| 11,085,605 B2 | 8/2021 | Iwakura | |
| 11,094,854 B2 | 8/2021 | Ichikawa et al. | |
| 2011/0210354 A1 | 9/2011 | Ichikawa et al. | |
| 2012/0300432 A1* | 11/2012 | Matsubayashi | H10H 20/8512 |
| | | | 362/84 |
| 2014/0084320 A1 | 3/2014 | Ichikawa et al. | |
| 2014/0131753 A1 | 5/2014 | Ishida et al. | |
| 2015/0085467 A1 | 3/2015 | Tsumori et al. | |
| 2015/0340577 A1 | 11/2015 | Ishida et al. | |
| 2016/0003440 A1 | 1/2016 | Wataya et al. | |
| 2016/0049566 A1 | 2/2016 | Ichikawa et al. | |
| 2016/0056357 A1 | 2/2016 | Ichikawa et al. | |
| 2017/0090095 A1 | 3/2017 | Iwakura et al. | |
| 2017/0141273 A1 | 5/2017 | Ichikawa et al. | |
| 2018/0301600 A1 | 10/2018 | Ichikawa et al. | |
| 2019/0035981 A1 | 1/2019 | Ichikawa et al. | |
| 2019/0088825 A1 | 3/2019 | Ichikawa et al. | |
| 2019/0234581 A1 | 8/2019 | Iwakura | |
| 2020/0287096 A1 | 9/2020 | Ichikawa et al. | |
| 2021/0332965 A1 | 10/2021 | Iwakura | |
| 2021/0336094 A1 | 10/2021 | Ichikawa et al. | |

FOREIGN PATENT DOCUMENTS

| | | |
|---|---|---|
| JP | 2010062272 A | 3/2010 |
| JP | 2012199288 A | 10/2012 |
| JP | 2014075186 A | 4/2014 |
| JP | 2014112635 A | 6/2014 |
| JP | 2015088220 A | 5/2015 |
| JP | 2015088483 A | 5/2015 |
| JP | 2017069392 A | 4/2017 |
| JP | 2019501526 A | 1/2019 |
| JP | 2019133794 A | 8/2019 |
| WO | 2017100190 A1 | 6/2017 |

* cited by examiner

LIGHT-EMITTING DEVICE

CROSS-REFERENCE TO RELATED APPLICATIONS

This application is a national stage entry of International Application No. PCT/JP2021/004900, filed on Feb. 10, 2021, which claims priority to Japanese Patent Application No. 2020-058695, filed on Mar. 27, 2020, the disclosure of which is hereby incorporated by reference in its entirety.

TECHNICAL FIELD

The present invention relates to a light-emitting device.

BACKGROUND ART

Light-emitting devices including a light-emitting element such as a light-emitting diode (hereinafter also referred to as "LED") and a wavelength conversion member including a fluorescent material are known.

For example, Patent Document 1 discloses a red light-emitting device that includes a blue light-emitting LED and a fluorescent material absorbing light emitted from the LED to emit light containing a red component, and that is used for rear lamps or stop lamps for vehicles.

CITATION LIST

Patent Document

Patent Document 1: Japanese Patent Laid-Open No. 2015-088220

SUMMARY OF THE INVENTION

Problem to be Solved by the Invention

The luminous flux of a light-emitting device is closely related to both the visual sensitivity curve of humans and the light emission spectrum in the light-emitting device. In particular, a red light-emitting device has a dominant wavelength in the region of relatively low intensity of visual sensitivity, which is located on the long wavelength side from the peak wavelength of the intensity of the visual sensitivity curve, and thus there is still room for further increasing the luminous flux.

Accordingly, an object of the present invention is to provide a light-emitting device having a high luminous flux.

Means for Solving Problem

An aspect of the present invention is a light-emitting device comprising a light-emitting element that has a dominant wavelength in a range of 380 nm or more and 485 nm or less, and a fluorescent material layer that comprises a fluorescent material emitting light by being excited by light emitted from the light-emitting element, and a neodymium compound, wherein the light-emitting device emits light having a dominant wavelength in a range of 584 nm or more and 780 nm or less.

Effect of the Invention

In accordance with the aspect of the present invention, a light-emitting device having a high luminous flux can be provided.

MODE(S) FOR CARRYING OUT THE INVENTION

Figure 1A:
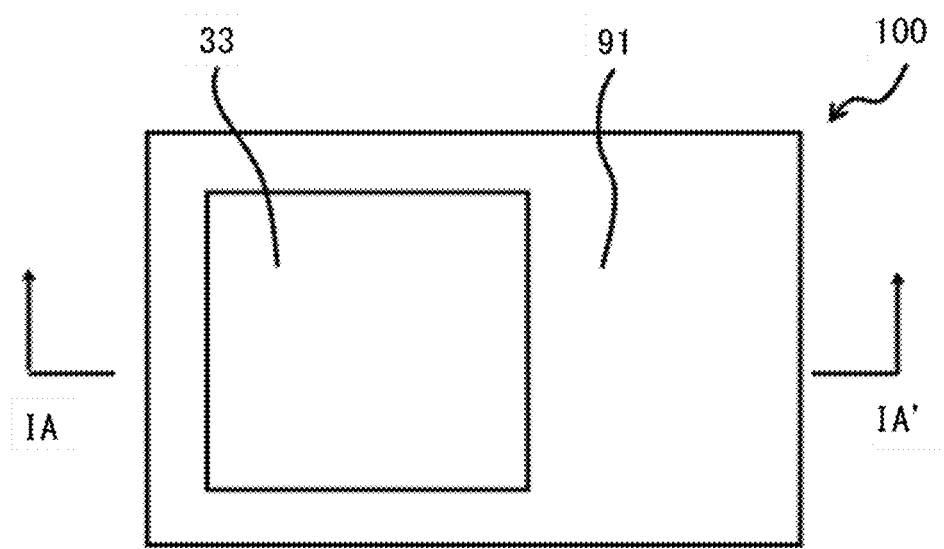
FIG. 1A is a schematic plan view of a light-emitting device according to a first embodiment.

The light-emitting device according to the present invention will be hereunder described on the basis of embodiments. The embodiments described below are exemplifications for embodying the technical idea of the present invention, and the present invention is not limited to the following light-emitting devices. The relationships between color names and chromaticity coordinates, and the relationships between wavelength ranges of light and color names of monochromic light are in accordance with Japanese Industrial Standard (JIS) Z8110.

The visual sensitivity curve of humans is a curve representing the intensity at which the human eye perceives brightness at each wavelength of light. In particular, the visual sensitivity curve of humans in photopic vision also refers to as a photopic standard specific luminous sensitivity, which is specified by CIE (Commission Internationale de l'Eclairage). The peak wavelength of the visual sensitivity curve of humans in photopic vision is 555 nm.

Light-Emitting Device

The light-emitting device includes a light-emitting element that has a dominant wavelength in a range of 380 nm or more and 485 nm or less, and a fluorescent material layer that contains a fluorescent material emitting light by being excited by light emitted from the light-emitting element, and a neodymium compound; and emits light having a dominant wavelength in a range of 584 nm or more and 780 nm or less. The dominant wavelength $\lambda$e of the light-emitting element refers to a wavelength of the point where the chromaticity coordinates (x=0.3333, y=0.3333) of white light and the chromaticity coordinates ($x_E$, $y_E$) of the light emission color of the light-emitting element are connected by a straight line in the CIE 1931 chromaticity diagram specified by CIE, and the extension line thereof and the spectrum locus intersect. The dominant wavelength $\lambda$d of the light-emitting device refers to a wavelength of the point where the chromaticity coordinates (x=0.3333, y=0.3333) of white light and the chromaticity coordinates ($x_D$, $y_D$) of the light emission color of the light-emitting device are connected by a straight line in the CIE 1931 chromaticity diagram, and the extension line thereof and the spectrum locus intersect. The "spectrum locus" refers to a curve obtained by connecting chromaticity points of monochromatic (pure) light on the chromaticity diagram. The dominant wavelength $\lambda$e of the light-emitting element and the dominant wavelength $\lambda$d of the light-emitting device can be measured using an optical measurement system combining a multichannel spectrometer and an integrating sphere. Since the light-emitting device contains the neodymium compound together with the fluorescent material in the fluorescent material layer, the neodymium compound absorbs light in a specific wavelength range emitted from the fluorescent material, thereby narrowing the half value width of the light emission spectrum of the light-emitting device. Specifically, the light-emitting device is able to narrow the half value width of the light emission spectrum in the wavelength range of 584 nm or more and 780 nm or less. By narrowing the half value width of the light emission spectrum of the light-emitting device, the dominant wavelength of the light emission color of the light-emitting device can be shifted to the long wavelength side compared to light-emitting devices provided with a fluorescent material layer that contains no neodymium compound and uses the same fluorescent material. When the half value width of the light emission spectrum of the light-emitting device can be narrowed and the dominant wavelength of the light-emitting device can be shifted to the long wavelength side, the light emission spectrum of the light-emitting device provided with the fluorescent material layer containing a neodymium compound can be made closer to the visual sensitivity curve of humans than the light emission spectrum of light-emitting devices provided with a fluorescent material layer having the same dominant wavelength and containing no neodymium compound, thereby increasing the luminous flux. The half value width refers to the full width at half maximum (FWHM) of the light emission peak in the light emission spectrum of a fluorescent material, and means a wavelength width of the light emission peak that indicates a value of 50% of the maximum value of the light emission peak in the light emission spectrum of the fluorescent material.

The light-emitting device emits light having a dominant wavelength in a range of 584 nm or more and 780 nm or less, and exhibits a yellowish-red light emission color. The light-emitting device may emit light having a dominant wavelength in a range of 600 nm or more and 780 nm or less, and may emit light having a dominant wavelength in a range of 610 nm or more and 780 nm or less.

Figure 5:
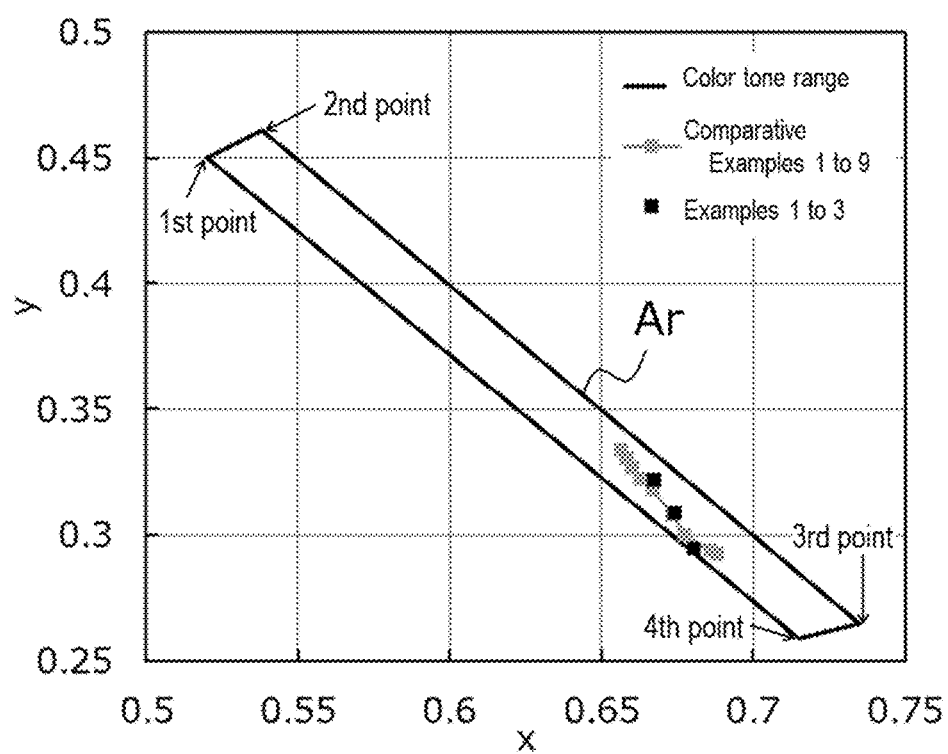
FIG. 5 is a diagram showing the chromaticity coordinates $(x_D, y_D)$ of the light emission color of each of light-emitting devices according to Examples 1 to 3 and Comparative Examples 1 to 9, and the target color tone range (area Ar), on the CIE 1931 chromaticity diagram.
Figure 15:
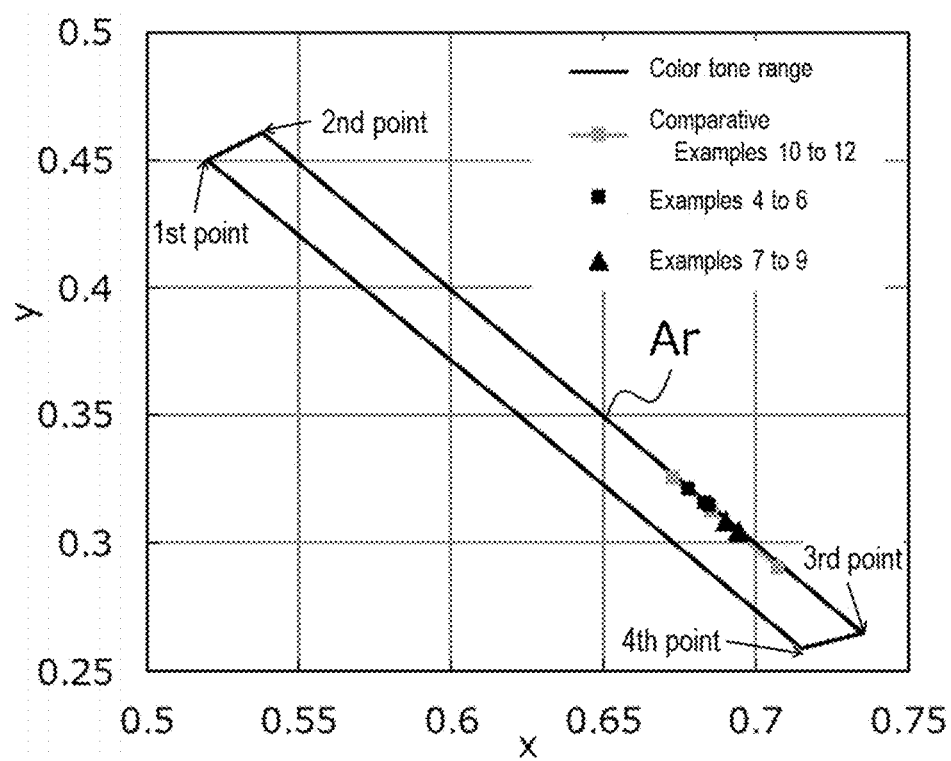
FIG. 15 is a diagram showing the chromaticity coordinates $(x_D, y_D)$ of the light emission color of each of the light-emitting devices according to Examples 4 to 9 and Comparative Examples 10 to 12, and the target color tone range (area Ar), on the CIE 1931 chromaticity diagram.

The light-emitting device preferably emits light having a chromaticity (hereinafter also referred to as "light emission color") within an area (hereinafter also referred to as "area Ar") of chromaticity coordinates (x, y) in the x-y chromaticity coordinate system of the CIE 1931 chromaticity diagram, in which when the chromaticity coordinates (x=0.520, y=0.450) is defined as a first point, the chromaticity coordinates (x=0.538, y=0.461) is defined as a second point, the chromaticity coordinates (x=0.735, y=0.265) is defined as a third point, and the chromaticity coordinates (x=0.715, y=0.259) is defined as a fourth point, the area Ar is demarcated by a first straight line connecting the first point and the second point, a second straight line connecting the second point and the third point, a third straight line connecting the third point and the fourth point, and a fourth straight line connecting the fourth point and the first point. FIGS. 5 and 15 described later show a part of the x-y chromaticity coordinate system of the CIE 1931 chromaticity diagram, and the light-emitting device preferably emits light having a chromaticity within the color tone range (area Ar) in FIGS. 5 and 15. The light-emitting device exhibits the light emission color within the area Ar in the x-y chromaticity coordinate system of the CIE 1931 chromaticity diagram, in which the light exhibiting the light emission color within the area Ar has a dominant wavelength in the range of 584 nm or more and 780 nm or less, and the color is red. The chromaticity ($x_D$, $y_D$) of the light emission color in the light-emitting device in the x-y chromaticity coordinate system of the CIE 1931 chromaticity diagram can be measured using an optical measurement system combining a multichannel spectrometer and an integrating sphere. The chromaticity ($x_D$, $y_D$) of the light emission color in the light-emitting device can be expressed in the x-y chromaticity coordinates of the CIE 1931 chromaticity diagram.

Figure 6:
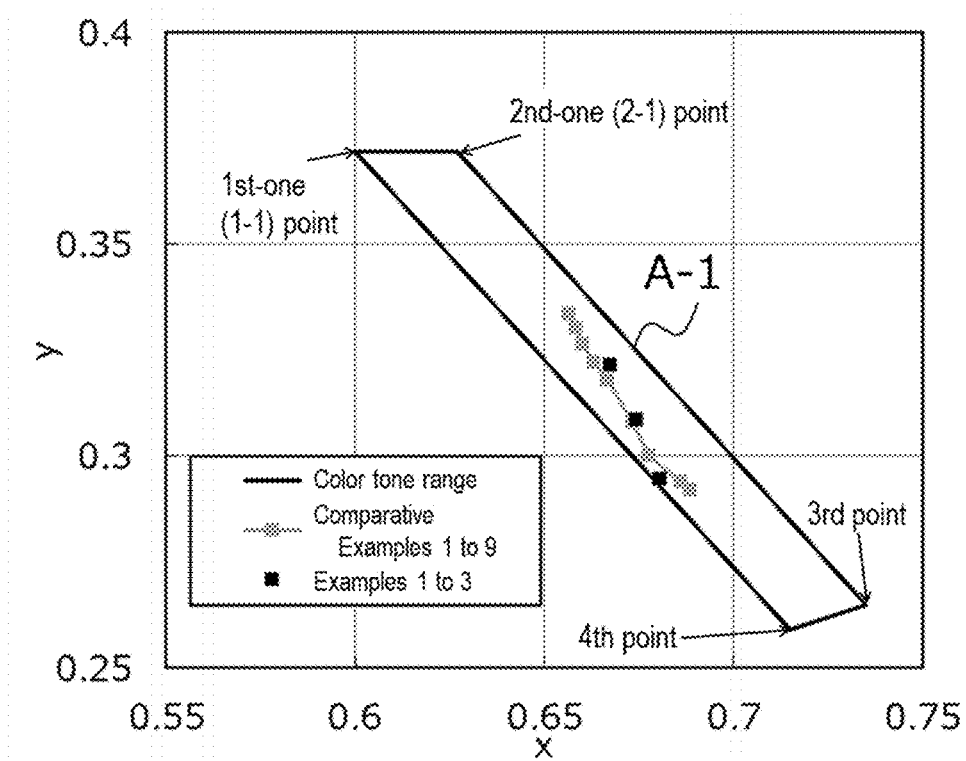
FIG. 6 is a diagram showing the chromaticity coordinates $(x_D, y_D)$ of the light emission color of each of the light-emitting devices according to Examples 1 to 3 and Comparative Examples 1 to 9, and the target color tone range (area A-1), on the CIE 1931 chromaticity diagram.
Figure 16:
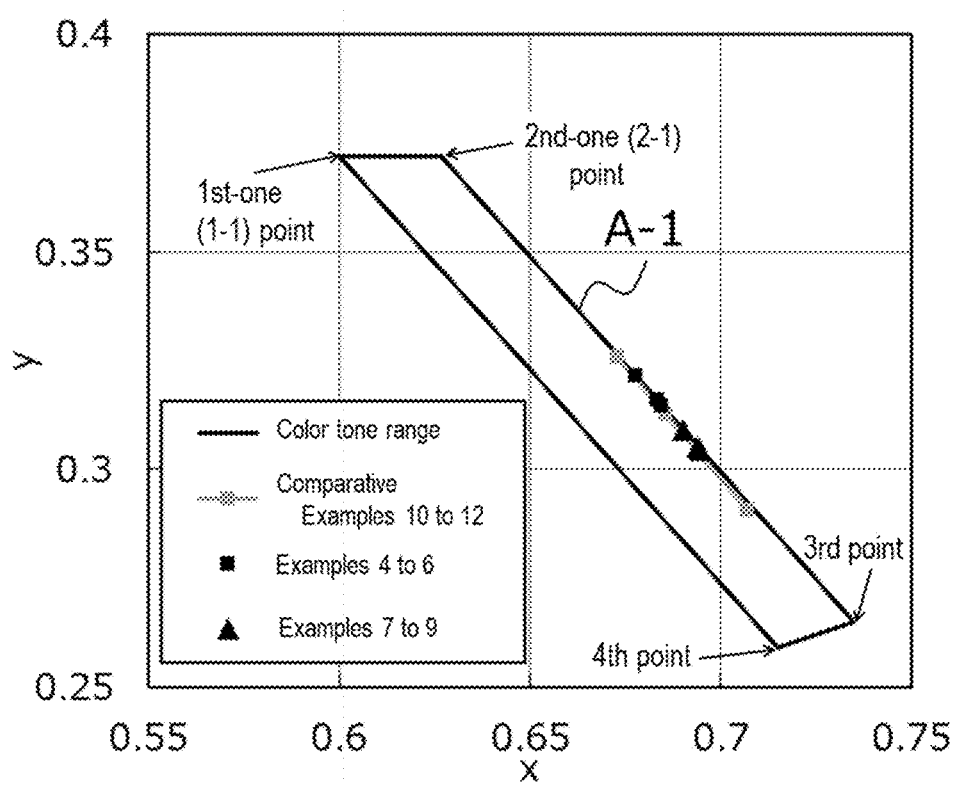
FIG. 16 is a diagram showing the chromaticity coordinates ($x_D$, $y_D$) of the light emission color of each of the light-emitting devices according to Examples 4 to 9 and Comparative Examples 10 to 12, and the target color tone range (area A-1), on the CIE 1931 chromaticity diagram.

The light-emitting device may emit light having a chromaticity within an area (hereinafter also referred to as "area A-1") of chromaticity coordinates (x, y) in the x-y chromaticity coordinate system of the CIE 1931 chromaticity diagram, in which when the chromaticity coordinates (x=0.600, y=0.372) is defined as a first-one (1-1) point, the chromaticity coordinates (x=0.627, y=0.372) is defined as a second-one (2-1) point, the chromaticity coordinates (x=0.735, y=0.265) is defined as a third point, and the chromaticity coordinates (x=0.715, y=0.259) is defined as a fourth point, the area A-1 is demarcated by a first-one (1-1) straight line connecting the first-one (1-1) point and the second-one (2-1) point, a second-one (2-1) straight line connecting the second-one (2-1) point and the third point, a third straight line connecting the third point and the fourth point, and a fourth-one (4-1) straight line connecting the fourth point and the first-one (1-1) point. FIGS. 6 and 16 described later show a part of the x-y chromaticity coordinate system of the CIE 1931 chromaticity diagram, and the light-emitting device may emit light having a chromaticity within the color tone range (area A-1) in FIGS. 6 and 16. The light-emitting device exhibits the light emission color within the area A-1 in the x-y chromaticity coordinate system of the CIE 1931 chromaticity diagram, in which the light exhibiting the light emission color within the area A-1 has a dominant wavelength in the range of 600 nm or more and 780 nm or less, and the color is red. The chromaticity ($x_D$, $y_D$) of the light emission color in the light-emitting device in the x-y chromaticity coordinate system of the CIE 1931 chromaticity diagram can be measured using an optical measurement system combining a multichannel spectrometer and an integrating sphere. The chromaticity ($x_D$, $y_D$) of the light emission color in the light-emitting device can be expressed in the x-y chromaticity coordinates of the CIE 1931 chromaticity diagram.

Figure 7:
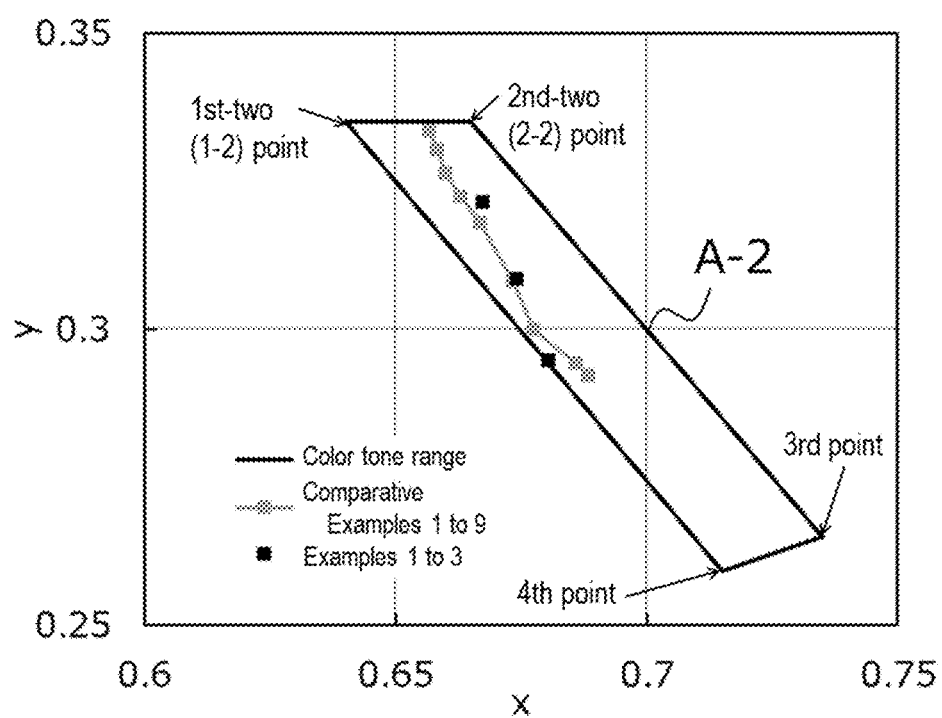
FIG. 7 is a diagram showing the chromaticity coordinates $(x_D, y_D)$ of the light emission color of each of the light-emitting devices according to Examples 1 to 3 and Comparative Examples 1 to 9, and the target color tone range (area A-2), on the CIE 1931 chromaticity diagram.
Figure 17:
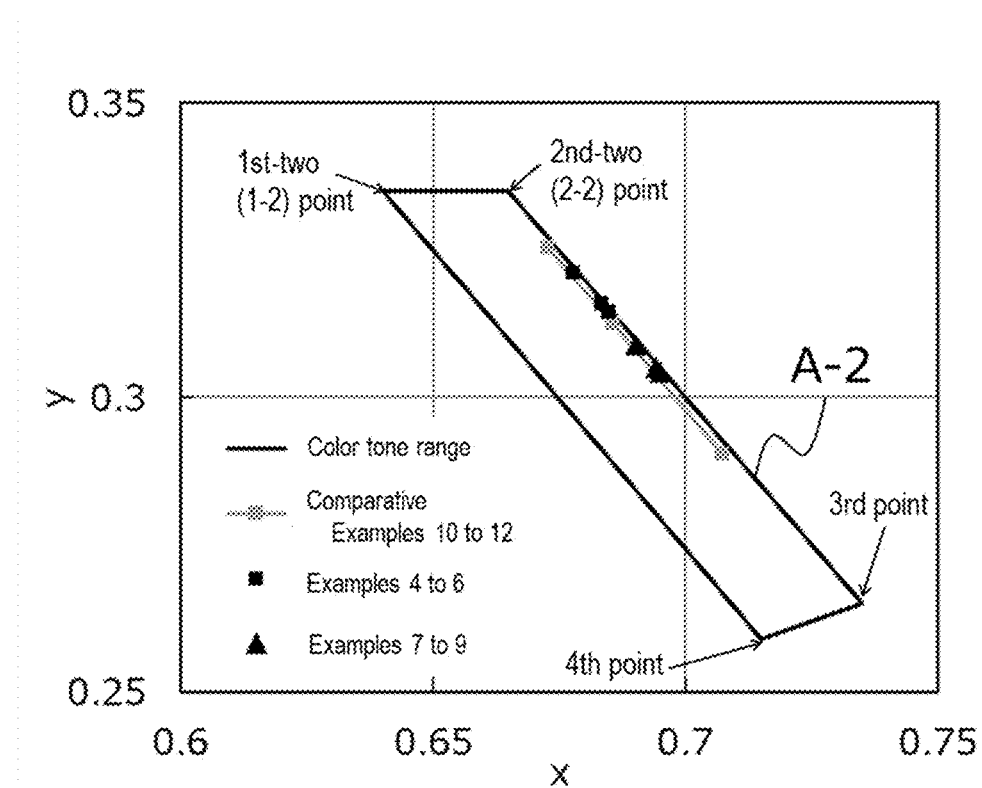
FIG. 17 is a diagram showing the chromaticity coordinates ($x_D$, $y_D$) of the light emission color of each of the light-emitting devices according to Examples 4 to 9 and Comparative Examples 10 to 12, and the target color tone range (area A-2), on the CIE 1931 chromaticity diagram.

The light-emitting device may emit light having a chromaticity within an area (hereinafter also referred to as "area A-2") of chromaticity coordinates (x, y) in the x-y chromaticity coordinate system of the CIE 1931 chromaticity diagram, in which when the chromaticity coordinates (x=0.640, y=0.335) is defined as a first-two (1-2) point, the chromaticity coordinates (x=0.665, y=0.335) is defined as a second-two (2-2) point, the chromaticity coordinates (x=0.735, y=0.265) is defined as a third point, and the chromaticity coordinates (x=0.715, y=0.259) is defined as a fourth point, the area A-2 is demarcated by a first-two (1-2) straight line connecting the first-two (1-2) point and the second-two (2-2) point, a second-two (2-2) straight line connecting the second-two (2-2) point and the third point, a third straight line connecting the third point and the fourth point, and a fourth-two (4-2) straight line connecting the fourth point and the first-two (1-2) point. FIGS. 7 and 17 described later show a part of the x-y chromaticity coordinate system of the CIE 1931 chromaticity diagram, and the light-emitting device may emit light having a chromaticity within the color tone range (area A-2) in FIGS. 7 and 17. The light-emitting device exhibits the light emission color within the area A-2 in the x-y chromaticity coordinate system of the CIE 1931 chromaticity diagram, in which the light exhibiting the light emission color within the area A-2 has a dominant wavelength in the range of 610 nm or more and 780 nm or less, and the color is red. The chromaticity ($x_D$, $y_D$) of the light emission color in the light-emitting device in the x-y chromaticity coordinate system of the CIE 1931 chromaticity diagram can be measured using an optical measurement system combining a multichannel spectrometer and an integrating sphere. The chromaticity ($x_D$, $y_D$) of the light emission color in the light-emitting device can be expressed in the x-y chromaticity coordinates of the CIE 1931 chromaticity diagram.

Fluorescent Material Layer

Neodymium Compound

Examples of the neodymium compound contained in the fluorescent material layer include neodymium fluoride, neodymium oxide, and neodymium hydroxide; and it is especially preferable to use neodymium fluoride or a neodymium compound having a reflection spectrum characteristic similar to that of neodymium fluoride. The neodymium compound absorbs a part of light emitted from the fluorescent material excited by light from the light-emitting element to change the shape of the light emission spectrum of the light-emitting device, thereby narrowing the half value width of the light emission spectrum of the light-emitting device. The neodymium compound has a central particle diameter preferably in a range of 0.05 μm or more and 0.50 μm or less, more preferably in a range of 0.08 μm or more and 0.40 μm or less, and even more preferably in a range of 0.10 μm or more and 0.30 μm or less. The central particle diameter refers to a volume average particle diameter (median diameter), and is a particle diameter (D50: median diameter) at which the volume cumulative frequency from the small diameter side reaches 50%. The central particle diameter can be measured using a laser diffraction particle size distribution measuring apparatus (for example, product name: Mastersizer 2000, manufactured by Malvern Panalytical Ltd.).

The reflection spectrum of the neodymium compound in the wavelength range of 380 nm or more and 780 nm or less can be measured by irradiating the neodymium compound with light from an excitation light source (xenon lamp) using a spectrophotometer (for example, product name: F-4500, manufactured by Hitachi High-Technologies Corp.) at room temperature (25° C.±5° C.). Calcium hydrogen phosphate ($CaHPO_4$) can be used as a reference sample. In the reflection spectrum obtained by determining the reflectance of the neodymium compound as the relative reflectance, the wavelength Wr representing the minimum reflection intensity in a wavelength range of 380 nm or more and 780 nm or less is preferably present in a range of 570 nm or more and 630 nm or less, more preferably present in a range of 575 nm or more and 620 nm or less, and even more preferably present in a range of 575 nm or more and 610 nm or less, with reference to the reflectance of calcium hydrogen phosphate to excitation light having an excitation wavelength of 450 nm.

The content of the neodymium compound in the fluorescent material layer is preferably in a range of 5 parts by mass or more and 40 parts by mass or less, more preferably in a range of 6 parts by mass or more and 35 parts by mass or less, and even more preferably in a range of 7 parts by mass or more and 30 parts by mass or less, relative to 100 parts by mass of the fluorescent material contained in the fluorescent material layer. When the content of the neodymium compound in the fluorescent material layer falls within the range of 5 parts by mass or more and 40 parts by mass or less relative to 100 parts by mass of the fluorescent material contained in the fluorescent material layer, the neodymium compound absorbs light in a specific wavelength range emitted from the fluorescent material, and the half value width of the light emission spectrum of the light-emitting device can be narrowed, so that the dominant wavelength of the light emitted from the light-emitting device can be shifted to the long wavelength side compared to light-emitting devices provided with a fluorescent material layer that contains no neodymium compound and uses the same fluorescent material.

Fluorescent Material

The fluorescent material contained in the fluorescent material layer preferably contains at least one nitride fluorescent material selected from the group consisting of a first nitride fluorescent material having a composition containing Ca, Eu, Si, Al, N, and optionally Sr, and a second nitride fluorescent material having a composition containing: at least one element selected from the group consisting of Ca, Sr, and Ba; Eu; Si; and N. When the fluorescent material contained in the fluorescent material layer contains at least one nitride fluorescent material selected from the group consisting of the first nitride fluorescent material and the second nitride fluorescent material, the fluorescent material is excited by light emitted from the light-emitting element having a dominant wavelength in a range of 380 nm or more and 485 nm or less, and light having a dominant wavelength in a wavelength range of 584 nm or more and 780 nm or less is emitted from the light-emitting device. When the fluorescent material contained in the fluorescent material layer contains at least one nitride fluorescent material selected from the group consisting of the first nitride fluorescent material and the second nitride fluorescent material, light having a light emission color in the area Ar in the x-y chromaticity coordinate system of the CIE 1931 chromaticity diagram is emitted from the light-emitting device. The light-emitting device provided with the fluorescent material layer containing at least one nitride fluorescent material selected from the group consisting of the first nitride fluorescent material and the second nitride fluorescent material may emit light exhibiting a light emission color in the area A-1 or the area A-2 in the x-y chromaticity coordinate system of the CIE 1931 chromaticity diagram. The dominant wavelength λp of the fluorescent material refers to a wavelength of the point where the chromaticity coordinates (x=0.3333, y=0.3333) of white light and the chromaticity coordinates ($x_p$, $y_p$) of the light emission color of the fluorescent material are connected by a straight line in the CIE 1931 chromaticity diagram, and the extension line thereof and the spectrum locus intersect. The chromaticity coordinates ($x_p$, $y_p$) of the light emission color of the fluorescent material can be measured from the light emission spectrum at room temperature (25° C.±5° C.) by irradiating each fluorescent material with excitation light having a wavelength of 450 nm, using a quantum efficiency measurement apparatus (for example, product name: QE-2000, manufactured by Otsuka Electronics Co., Ltd.). The peak wavelength λp of the fluorescent material refers to a wavelength indicating the peak top in the light emission spectrum of the fluorescent material, and can be determined from the light emission spectrum of the fluorescent material measured using the apparatus.

The fluorescent material contained in the fluorescent material layer preferably contains at least one nitride fluorescent material selected from the group consisting of a first nitride fluorescent material having a composition represented by the following formula (1), and a second nitride fluorescent material having a composition represented by the following formula (2).

$(Ca,Sr)AlSiN_3:Eu$      (1)

$(Ca,Sr,Ba)_2Si_5N_8:Eu$      (2)

Plural elements sectioned by comma (,) in the formula representing the composition of a fluorescent material mean that at least one of these plural elements is contained in the composition, and a combination of two or more of these plural elements may be contained. In the formula representing the composition of a fluorescent material, the part before the colon (:) represents the elements and the molar ratio constituting a host crystal, and the part after the colon (:) represents an activating element. The "molar ratio" represents the molar amount of an element in 1 mol of the composition of the fluorescent material.

The fluorescent material contained in the fluorescent material layer preferably contains at least one nitride fluorescent material selected from the group consisting of a first nitride fluorescent material having a composition represented by the following formula (1A), and a second nitride fluorescent material having a composition represented by the following formula (2A).

$Sr_tCa_vEu_wAl_xSi_yN_z$      (1A)

wherein t, v, w, x, y, and z are numbers satisfying $0 \leq t < 1$, $0 < v < 1$, $0.01 < w \leq 0.04$, $t+v+w<1$, $0.80 \leq x \leq 1.2$, $0.80 \leq y \leq 1.2$, and $2.5 \leq z \leq 3.5$.

$(Ca_{1-p-q-r}Sr_pBa_qEu_r)_2Si_5N_8$      (2A)

wherein p, q, and r are numbers satisfying $0 \leq p \leq 1.0$, $0 \leq q \leq 1.0$, $0 < r < 1.0$, and $p+q+r<1.0$.

The first nitride fluorescent material includes a first nitride fluorescent material having a composition represented by the formula (1) and a first nitride fluorescent material represented by the formula (1A). The second nitride fluorescent material includes a second nitride fluorescent material having a composition represented by the formula (2) and a second nitride fluorescent material represented by the formula (2A).

In the first nitride fluorescent material and the second nitride fluorescent material, the reflectance at 450 nm is preferably 10% or less, more preferably 9% or less, and even more preferably 8% or less; and may be 1% or more. When the reflectance of the first nitride fluorescent material and the second nitride fluorescent material at 450 nm is 10% or less, the above-mentioned fluorescent materials well absorb the light emitted from the light-emitting element having a dominant wavelength in a range of 380 nm or more and 485 nm or less for wavelength conversion, and can emit light having a dominant wavelength in a range of 584 nm or more and 780 nm or less, may emit light having a dominant wavelength in a range of 600 nm or more and 780 nm or less, and may emit light having a dominant wavelength in a range of 610 nm or more and 780 nm or less. The reflectance of the first nitride fluorescent material and the second nitride fluorescent material at 450 nm can be determined by irradiating the fluorescent materials serving as samples with light from an excitation light source (xenon lamp) using a spectrophotometer (for example, product name: F-4500, manufactured by Hitachi High-Technologies Corp.) at room temperature (25° C.±5° C.), and by measuring the reflection spectrum in the wavelength range of 380 nm or more and 780 nm or less. Calcium hydrogen phosphate ($CaHPO_4$) can be used as a reference sample. The reflectance of the fluorescent materials serving as samples at 450 nm can be determined as the relative reflectance, with reference to the reflectance of calcium hydrogen phosphate to excitation light having an excitation wavelength of 450 nm.

The average particle diameter of the fluorescent material is preferably in a range of 2 μm or more and 40 μm or less, more preferably in a range of 5 μm or more and 30 μm or less, and even more preferably in a range of 10 μm or more and 30 μm or less. When the particle diameter of the fluorescent material particles is larger, the wavelength of the light emitted from the light-emitting element can be more efficiently converted, and scattering of the light can be reduced to improve the light extraction efficiency. Meanwhile, when the fluorescent material particles are too large, the handleability is lowered. The average particle diameter of the fluorescent material particles can be measured according to a Fisher Sub-Sieve Sizer (FSSS) method, and the average particle diameter measured according to the FSSS method is a Fisher Sub-Sieve Sizer's number.

The fluorescent material layer preferably contains a resin. In the fluorescent material layer, the content of the fluorescent material is preferably in a range of 100 parts by mass or more and 300 parts by mass or less, more preferably in a range of 150 parts by mass or more and 280 parts by mass or less, even more preferably in a range of 180 parts by mass or more and 250 parts by mass or less, and still more preferably in a range of 190 parts by mass or more and 210 parts by mass or less, relative to 100 parts by mass of the resin. When the content of the fluorescent material in the fluorescent material layer falls within the range of 100 parts by mass or more and 300 parts by mass or less relative to 100 parts by mass of the resin, the neodymium compound contained in the fluorescent material layer absorbs a part of light emitted from the fluorescent material, and the half value width of the light emission spectrum of the light-emitting device can be narrowed, so that the light emission spectrum of the light-emitting device can be made closer to the visual sensitivity curve of humans to enhance the luminous flux. The fluorescent material layer may contain a transparent material such as glass or an inorganic substance other than glass instead of the resin, and the content of the fluorescent material relative to 100 parts by mass of the resin can be replaced with the content of the fluorescent material relative to 100 parts by mass of glass or an inorganic substance other than glass. The fluorescent material layer may be integrated with a transparent member such as a transparent body to constitute a wavelength conversion member, as described later. The glass can be selected from, for example, borosilicate glass, quartz glass, soda quartz glass, soda lime glass, and lead glass. The inorganic substance other than glass can be selected from, for example, aluminum oxide, calcium fluoride, magnesium fluoride, and barium fluoride.

Examples of the resin contained in the fluorescent material layer include at least one resin selected from the group consisting of an epoxy resin, a silicone resin, a phenol resin, and a polyimide resin. Of these, a silicone resin is preferred since it has excellent light resistance.

The fluorescent material layer may contain a fluorescent material other than the above-mentioned first and second nitride fluorescent materials as long as the light-emitting device emits light having a dominant wavelength in the range of 584 nm or more and 780 nm or less. Even when the fluorescent material layer contains the other fluorescent material, the light-emitting device provided with the fluorescent material layer containing the other fluorescent material preferably emits light having a dominant wavelength in a range of 584 nm or more and 780 nm or less, and exhibiting the light emission color within the area Ar of the color tone range in the x-y chromaticity coordinate system of the CIE 1931 chromaticity diagram, by being excited with light emitted from the light-emitting element having a dominant wavelength in a range of 380 nm or more and 485 nm or less. The light-emitting device provided with the fluorescent material layer containing the other fluorescent material may emit light having a dominant wavelength in a range of 600 nm or more and 780 nm or less, and exhibiting the light emission color within the area A-1 of the color tone range in the x-y chromaticity coordinate system of the CIE 1931 chromaticity diagram, by being excited with light emitted from the light-emitting element having a dominant wavelength in a range of 380 nm or more and 485 nm or less. The light-emitting device provided with the fluorescent material layer containing the other fluorescent material may emit light having a dominant wavelength in a range of 610 nm or more and 780 nm or less, and exhibiting the light emission color within the area A-2 of the color tone range in the x-y chromaticity coordinate system of the CIE 1931 chromaticity diagram, by being excited with light emitted from the light-emitting element having a dominant wavelength in a range of 380 nm or more and 485 nm or less. Examples of the fluorescent material other than the first nitride fluorescent material and the second nitride fluorescent material include $Si_{6-z}Al_zO_zN_{8-z}$:Eu (0<z≤4.2), $Ca_3Sc_2Si_3O_{12}$:Ce, $CaSc_2O_4$:Ce, $(La,Y,Gd)_3(Al,Si)_6N_{11}$:Ce, $(Ca,Sr,Ba)_8MgSi_4O_{16}(F,Cl,Br)_2$:Eu, $(Ca,Sr,Ba)_3Si_6O_9N_4$:Eu, $(Ca,Sr,Ba)_3Si_6O_{12}N_2$:Eu, $(Ba, Sr, Ca)Si_2O_2N_2$:Eu, $(Ba,Sr,Ca,Mg)_2SiO_4$:Eu, $(Ca,Sr,Ba)S$:Eu, $(Ba, Sr, Ca)Ga_2S_4$:Eu, $K_2(Si,Ti,Ge)F_6$:Mn, $(Ca,Sr,Ba,Mg)_{10}(PO_4)_6(F,Cl,Br,I,OH)_2$:Eu, $(Ba,Sr,Ca)_3MgSi_2O_8$:Eu, $3.5MgO·0.5MgF_2·GeO_2$:Mn, $Sr_4Al_{14}O_{25}$:Eu, $(Si,Al)_6(O,N)_8$:Eu, and $(Sr,Ca)LiAl_3N_4$:Eu. Of these, particularly preferred red light-emitting fluorescent materials include, for example, $K_2(Si,Ti,Ge)F_6$:Mn, $3.5MgO·0.5MgF_2GeO_2$:Mn, and $(Sr,Ca)LiAl_3N_4$:Eu.

A colorant, a diffusing material, and a filler may be added to the fluorescent material layer, as necessary. As the diffusing agent or the filler, at least one selected from the group consisting of titanium oxide, barium titanate, aluminum oxide, and silicon oxide can be used.

The half value width in the light emission spectrum of the light-emitting device in the wavelength range of 584 nm or more and 780 nm or less is preferably in a range of 50 nm or more and 100 nm or less, and more preferably in a range of 60 nm or more and 95 nm or less. The wavelength range of the light emission spectrum of the light-emitting device for measuring the half value width may be in a range of 600 nm or more and 780 nm or less, and may be in a range of 610 nm or more and 780 nm or less. When the half value width in the light emission spectrum of the light-emitting device in the wavelength range of 584 nm or more and 780 nm or less falls within the range of 50 nm or more and 100 nm or less, the neodymium compound absorbs a part of light emitted from the fluorescent material excited by the excitation light of the light-emitting element, and the half value width of the light emission spectrum can be narrowed, so that the dominant wavelength of the light emitted from the light-emitting device can be shifted to the long wavelength side compared to light-emitting devices provided with a fluorescent material layer that contains no neodymium compound and uses the same fluorescent material. When the half value width in the light emission spectrum of the light-emitting device is narrow and the dominant wavelength of the light-emitting device is shifted to the long wavelength side, the light emission spectrum of the light-emitting device provided with the fluorescent material layer containing a neodymium compound can be made closer to the higher intensity of the visual sensitivity curve of humans than the light emission spectrum of light-emitting devices provided with a fluorescent material layer emitting light having the same dominant wavelength, and containing no neodymium compound, thereby increasing the luminous flux.

Figure 1B:
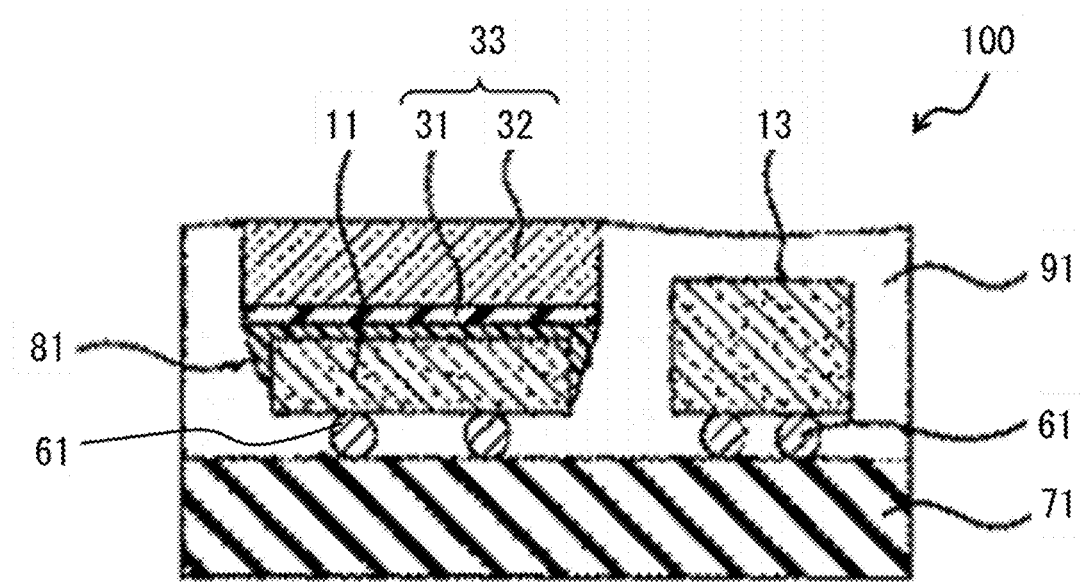
FIG. 1B is a schematic cross-sectional view of the light-emitting device according to the first embodiment.

An example of a light-emitting device according to a first embodiment will be described with reference to the drawings. FIG. 1A shows a schematic plan view of a light-emitting device 100 according to the first embodiment, and FIG. 1B shows a schematic cross-sectional view of the IA-IA' line of the light-emitting device 100.

The light-emitting device 100 includes a light-emitting element 11 that has a dominant wavelength in a range of 380 nm or more and 485 nm or less, and a wavelength conversion member 33 that includes a fluorescent material layer 31 containing at least one fluorescent material emitting light by being excited by light emitted from the light-emitting element 11 and a neodymium compound, and that includes a transparent body 32 integrally disposed with the fluorescent material layer 31. The light-emitting element 11 is flip-chip mounted on a substrate 71 via bumps that are conductive members 61. The fluorescent material layer 31 of the wavelength conversion member 33 is arranged on the light-emitting surface of the light-emitting element 11 via an adhesive layer 81. The side surfaces of the light-emitting element 11 and the wavelength conversion member 33 are covered with a covering member 91 that reflects light. The fluorescent material layer 31 may contain 2 or more fluorescent materials having different light emission peak wavelength ranges. The light-emitting element 11 receives electric power from the outside of the light-emitting device 100 via wiring and the conductive members 60 disposed on the substrate 71, so that the light-emitting device 100 is able to emit light. The light-emitting device 100 may include a semiconductor element 13 for preventing the light-emitting element 11 from being destroyed by applying an excessive voltage. The covering member 91 is provided so as to cover, for example, the semiconductor element 13. The light-emitting device 100 emits light having a dominant wavelength in a range of 584 nm or more and 780 nm or less. The light-emitting device 100 emits light exhibiting the light emission color within the above-mentioned area Ar of the color tone range in the x-y chromaticity coordinate system of the CIE 1931 chromaticity diagram. The light-emitting device 100 may emit light having a dominant wavelength in a range of 600 nm or more and 780 nm or less. The light-emitting device 100 may emit light exhibiting the light emission color within the above-mentioned area A-1 of the color tone range in the x-y chromaticity coordinate system of the CIE 1931 chromaticity diagram. The light-emitting device 100 may emit light having a dominant wavelength in a range of 610 nm or more and 780 nm or less. The light-emitting device 100 may emit light exhibiting the light emission color within the above-mentioned area A-2 of the color tone range in the x-y chromaticity coordinate system of the CIE 1931 chromaticity diagram. Each member used in the light-emitting device according to the first embodiment will be hereunder described. For the details of each member used in the light-emitting device according to the first embodiment and the production method, for example, the disclosure of Japanese Unexamined Patent Publication No. 2014-112635 may be referred to.

Substrate 71

Examples of the material of the substrate 71 include an inorganic material selected from aluminum oxide and aluminum nitride, and a resin selected from a phenol resin, an epoxy resin, a polyimide resin, a bismaleimide triazine resin (BT resin), and a polyphthalamide resin.

Light-Emitting Element 11

The light-emitting element 11 emits light having a dominant wavelength in a range of 380 nm or more and 485 nm or less. As the light-emitting element 11, for example, a light-emitting diode (LED) or a laser diode (LD) can be used, and an LED chip is preferably used. As the light-emitting element 11, a semiconductor light-emitting element using a nitride semiconductor represented by $In_XAl_YGa_{1-X-Y}N$ ($0 \leq X$, $0 \leq Y$, and $X+Y \leq 1$) can be used. In the nitride semiconductor, various light emission wavelengths can be selected depending on the material of the semiconductor layer and the mixed crystal degree thereof.

Wavelength Conversion Member 33

Fluorescent Material Layer 31

The light-emitting device 100 includes a fluorescent material layer 31. The light-emitting device 100 may include a wavelength conversion member in which the fluorescent material layer 31 and a transparent body 32 are integrated. The fluorescent material layer 31 contains a transparent material serving as a binder, a fluorescent material, and a neodymium compound. The transparent material, which serves as a binder, contained in the fluorescent material layer 31 is preferably a resin, glass, or an inorganic substance other than glass. The contents of the fluorescent material and the neodymium compound in the fluorescent material layer 31 are in the same ranges as the content ranges of the fluorescent material and the neodymium compound in the fluorescent material layer 31 described above. The fluorescent material layer 31 may be a single layer containing one type of fluorescent material, and may have a laminated structure in which one layer containing one type of fluorescent material and another layer containing another type of fluorescent material are laminated. A colorant, a diffusing material, and a filler may be added to the fluorescent material layer 31, as necessary. The fluorescent material layer 31 may be a sheet-shaped layer composed of a fluorescent material, a neodymium compound, and a resin. The fluorescent material layer 31 may be a plate-shaped layer composed of a fluorescent material, a neodymium compound, and glass. The fluorescent material layer 31 may be a layer made of a plate-shaped sintered body composed of a fluorescent material, a neodymium compound, and ceramics other than glass. The fluorescent material layer 31 absorbs light emitted from the light-emitting element 11 to emit light having a dominant wavelength in a range of 584 nm or more and 780 nm or less. The fluorescent material layer 31 absorbs light emitted from the light-emitting element 11 to emit light exhibiting the light emission color within the above-mentioned area Ar in the x-y chromaticity coordinate system of the CIE 1931 chromaticity diagram from the light-emitting device 100. The fluorescent material layer 31 may absorb light emitted from the light-emitting element 11 to emit light having a dominant wavelength in a range of 600 nm or more and 780 nm or less. The fluorescent material layer 31 may absorb light emitted from the light-emitting element 11 to emit light exhibiting the light emission color within the above-mentioned area A-1 in the x-y chromaticity coordinate system of the CIE 1931 chromaticity diagram from the light-emitting device 100. The fluorescent material layer 31 may absorb light emitted from the light-emitting element 11 to emit light having a dominant wavelength in a range of 610 nm or more and 780 nm or less. The fluorescent material layer 31 may absorb light emitted from the light-emitting element 11 to emit light exhibiting the light emission color within the above-mentioned area A-2 in the x-y chromaticity coordinate system of the CIE 1931 chromaticity diagram from the light-emitting device 100.

In the fluorescent material layer 31, at least a part of the light emitted from the light-emitting element 11 is absorbed by the fluorescent material, and light having a different wavelength is emitted from the fluorescent material. A part of the light emitted from the fluorescent material is absorbed by the neodymium compound. The fluorescent material layer 31 may be disposed on the surface of the transparent body 32 by printing, compression molding, fluorescent material electrodeposition, or adhesion of fluorescent material sheets. The fluorescent material layer 31 includes not only in the case where the fluorescent material layer 31 is in direct contact with the surface of the transparent body, but also in the case where the fluorescent material layer 31 is bonded via another member such as an adhesive. Examples of the method of bonding the fluorescent material layer 31 with the transparent body 32 include pressure bonding, fusing, sintering, bonding with an organic adhesive, and bonding with an inorganic adhesive such as low melting point glass.

The thickness of the fluorescent material layer 31 is preferably in a range of 20 μm or more and 200 μm or less, and more preferably in a range of 30 μm or more and 150 μm or less. When the thickness of the fluorescent material layer 31 falls within the range of 20 μm or more and 200 μm or less, the fluorescent material in an amount capable of emitting light having a dominant wavelength within a desired wavelength range can be contained in the fluorescent material layer while maintaining the heat radiation properties of the fluorescent material layer. Further, when the thickness of the fluorescent material layer 31 falls within the range of 20 μm or more and 200 μm or less, the fluorescent material in an amount capable of emitting light exhibiting a desired light emission color within the area Ar, the area A-1, or the area A-2 in the x-y chromaticity coordinate system of the CIE 1931 chromaticity diagram from the light-emitting device 100 can be contained in the fluorescent material layer while maintaining the heat radiation properties of the fluorescent material layer.

Transparent Body 32

The transparent body 32 is a member provided separately from the fluorescent material layer 31, and is a member supporting the fluorescent material layer 31. As the transparent body 32, a plate-shaped body made of a transparent material such as glass or a resin can be used. The glass can be selected from, for example, borosilicate glass and quartz glass. The resin can be selected from, for example, a silicone resin and an epoxy resin. The thickness of the transparent body 32 may be a thickness capable of imparting sufficient mechanical strength to the fluorescent material layer 31 without lowering the mechanical strength in the producing process. When the thickness of the transparent body 32 is too thick, it may hinder the miniaturization of the light-emitting device and reduce the radiation properties, and it is thus preferable to be an appropriate thickness. The transparent body 32 may contain a diffusing material. When the content of the fluorescent material in the fluorescent material layer 31 is large, color unevenness in the fluorescent material layer 31 is likely to occur, but in the presence of the diffusing material, color unevenness and further brightness unevenness can be suppressed. As the diffusing material, titanium oxide, barium titanate, aluminum oxide, silicon oxide, and the like can be used. The upper surface of the transparent body 32 serving as the light-emitting surface is not limited to a flat surface, and may have fine irregularities. When the light-emitting surface of the transparent body 32 has fine irregularities, scattering of the light emitted from the light-emitting surface can be promoted to further suppress brightness unevenness and color unevenness.

Adhesive Layer 81

An adhesive layer 81 may be interposed between the light-emitting element 11 and the fluorescent material layer 31. The adhesive layer 81 fixes the light-emitting element 11 and the fluorescent material layer 31. The adhesive constituting the adhesive layer 81 is preferably a material capable of effectively guiding the light emitted from the light-emitting element 11 to the fluorescent material layer 31 and connecting the light-emitting element 11 and the fluorescent material layer 31. As a specific example, at least one organic resin selected from the group consisting of an epoxy resin, a silicone resin, a phenol resin, and a polyimide resin is preferred, and a silicone resin is more preferred.

In the case of using a silicone resin as the binder of the fluorescent material layer 31, it is also preferable to use a silicone resin for the adhesive of the adhesive layer 81. When the binder of the fluorescent material layer 31 and the resin constituting the adhesive layer 81 are silicone resin, the difference in refractive index between the fluorescent material layer 31 and the adhesive layer 81 can be reduced, which increases the incident light from the adhesive layer 81 to the fluorescent material layer 31.

Semiconductor Element 13

The semiconductor element 13 may be arranged on the substrate 71 next to the light-emitting element 11 separately from the light-emitting element 11. Examples of the semiconductor element 13 include a transistor and a protective element described below. The protective element is an element for protecting the light-emitting element 11 from element destruction or performance deterioration due to excessive voltage application. Specifically, the protective element may be a Zener diode that is energized when a voltage equal to or higher than a specified voltage is applied.

Covering Member 91

As the material of the covering member 91, an insulating material is preferably used. In order to ensure a certain degree of strength, examples of the insulating material constituting the covering member 91 include resin selected from the group consisting of a phenol resin, an epoxy resin, a bismaleimide triazine resin (BT resin), a polyphthalamide (PPA) resin, and a silicone resin. A colorant, a filler serving as a light reflecting material, and a fluorescent material may be added to the insulating material, as necessary.

The covering member 91 can be disposed, for example, by filling the space between the light emitting element 11 and the wavelength conversion member 33 including the fluorescent material layer 31 and the transparent body 32, and the semiconductor element 13 with an insulating material constituting the covering member 91 on the top side of the fixed substrate 71, using a resin ejector that can be moved in the vertical or horizontal direction with respect to the substrate 71.

Light Reflecting Material

The covering member 91 preferably contains a filler serving as a light reflecting material in the insulating material serving as a host. It is preferable that the light reflecting material is less likely to absorb light emitted from the light-emitting element 11, and has a large difference in refractive index with respect to the insulating material serving as the host of the covering member 91. The light reflecting material is dispersed and contained in the covering member 91, so that the light emitted from the light-emitting element 11 can be efficiently reflected. The light reflecting material is preferably an oxide containing at least one element selected from the group consisting of yttrium, zirconium, aluminum, titanium, magnesium, and silicon; and examples thereof include titanium oxide. The average particle diameter of the light reflecting material is, for example, in a range of 0.1 µm or more and 1.0 µm or less. The average particle diameter of the light reflecting material can use a catalog value, and can be measured, for example, by the FSSS method. The amount of the light reflecting material contained in the covering member 91 is preferably in a range of 10 parts by mass or more and 100 parts by mass or less relative to 100 parts by mass of the resin, in consideration of reflectivity and handleability.

Conductive Member 61

A bump can be used as the conductive member 61; and gold (Au) or an alloy thereof can be used as the material of the bump, and eutectic solder (Au—Sn), Pb—Sn, lead-free solder, or the like can be used as the other conductive bonding member. Although FIG. 1B shows an example of using a bump as the conductive member 61, the conductive member 61 is not limited to the bump, and may be, for example, a conductive paste.

Hereinafter, an example of the method for producing a light-emitting device according to the first embodiment will be described.

The method for producing a light-emitting device includes the following first to fourth steps.

A. The first step includes a step of mounting a light-emitting element on a substrate.

B. The second step includes a step of forming a fluorescent material layer on a transparent body, and forming a wavelength conversion member in which the transparent body and the fluorescent material layer are integrated.

C. The third step includes a step of arranging and bonding the wavelength conversion member on the light-emitting element.

D. The fourth step includes a step of covering the side surface of the wavelength conversion member excluding the light-emitting surface, and the side surface of the light-emitting element with a covering member composition to form a covering member.

First Step

In the first step, a light-emitting element is arranged on a substrate. A semiconductor element may also be arranged. The light emitting element and the semiconductor element are, for example, flip-chip mounted on the substrate.

Second Step

In the second step, a fluorescent material layer is disposed on a transparent body, and a wavelength conversion member in which the transparent body and the fluorescent material layer are integrated is disposed.

First, a plate-shaped transparent body is prepared. Next, a fluorescent material layer is disposed on the transparent body.

The fluorescent material layer can be disposed on the transparent body by, for example, a printing method. In the printing method, a fluorescent material layer-forming composition containing a fluorescent material, a neodymium compound, a binder, and optionally a solvent is prepared, and the fluorescent material layer-forming composition is coated on the transparent body and dried to form a fluorescent material layer, thereby forming a wavelength conversion member including the transparent body and the fluorescent material layer. As the binder, for example, an organic binder such as an epoxy resin, a silicone resin, a phenol resin, or a polyimide resin, and an inorganic binder containing glass or an inorganic substance other than glass can be used.

The fluorescent material layer can be disposed by a compression molding method, a fluorescent material electrodeposition method, a fluorescent material sheet method, or the like, instead of the printing method. The compression molding method is a method of molding a material for a fluorescent material layer containing a fluorescent material, a neodymium compound, and a binder with a die, on a transparent body. The fluorescent material electrodeposition method is a method in which a conductive thin film having translucency is disposed on the surface of a transparent body, and a charged fluorescent material and a neodymium compound are deposited on the thin film by utilizing electrophoresis. The fluorescent material sheet method is a method in which a fluorescent material and a neodymium compound are kneaded into a binder, and a fluorescent material sheet that is processed into a sheet-shape is fixed to the surface of a transparent body; and is a method in which, for example, a fluorescent material sheet having a thickness of 100 µm or less is pressure-bonded to the surface of a transparent body to be integrated.

Thus, the wavelength conversion member in which the transparent body and the fluorescent material layer are integrated is disposed. The surface of the wavelength conversion member preferably has a shape in which the area is slightly larger than the light-emitting surface of the light-emitting element in consideration of mounting accuracy.

Third Step

In the third step, the fluorescent material layer is opposed to the light-emitting surface of the light-emitting element, and the wavelength conversion member is bonded onto the light-emitting element with an adhesive layer. In a preferred embodiment of the bonding surface between the wavelength conversion member and the light-emitting element, that is, the bonding surface between the fluorescent material layer and the light-emitting element, since the bonding surface of the fluorescent material layer is larger than the light-emitting surface of the light-emitting element, the bonding surface of the fluorescent material layer protrudes from the light-emitting surface of the light-emitting element, and the adhesive adheres at the area from the protruded area to the side surface of the light-emitting element to form a protruding portion of the adhesive layer having a substantially triangular cross-sectional shape. The protruding portion of the adhesive layer adhering to the side surface of the light-emitting element has a triangular shape in which the thickness of the layer decreases toward the lower side of the light-emitting element.

Fourth Step

In the fourth step, the side surface of the wavelength conversion member excluding the light-emitting surface is covered with a covering member composition to form a covering member on the side surface of the wavelength conversion member excluding the light-emitting surface. The covering member is for reflecting light emitted from the light-emitting element, and is disposed so as to cover the side surface of the wavelength conversion member without covering the upper surface and to embed a semiconductor element. Since the protruding portion adhering to the side surface of the light-emitting element has a triangular cross-sectional shape in which the thickness decreases toward the lower side of the light-emitting element, the covering member covering the side surface of the light-emitting element has an inclination that expands as it goes upward. This allows light emitted from the side surface of the light-emitting element to be reflected toward the fluorescent material layer to excite the fluorescent material, thereby improving the brightness.

Thus, the light-emitting device according to the first embodiment shown in FIGS. 1A and 1B can be produced. In the case of producing a light-emitting device with no substrate, the substrate may be removed after forming the covering member, or after forming the covering member and before or after cutting the substrate.

Figure 2:
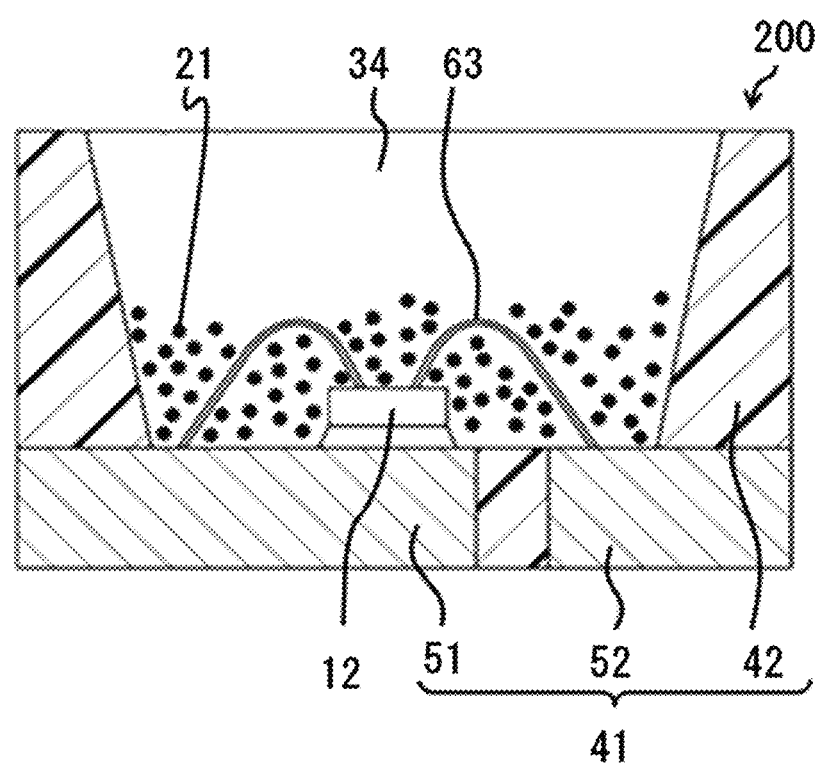
FIG. 2 is a schematic cross-sectional view of a light-emitting device according to a second embodiment.

An example of a light-emitting device according to a second embodiment will be described with reference to the drawings. FIG. 2 shows a schematic cross-sectional view of a light-emitting device 200 according to the second embodiment.

Light-Emitting Device 200

The light-emitting device 200 includes a light-emitting element 12 having a dominant wavelength in a range of 380 nm or more and 485 nm or less, a wavelength conversion member 34 composed of a fluorescent material layer containing at least one fluorescent material 21 that is excited by light emitted from the light-emitting element 12 and emits light, and a molded body 41. The molded body 41 is disposed by integrally molding a first lead 51, a second lead 52, and a resin portion 42 containing a resin. The molded body 41 has a recessed portion having a bottom surface and side surfaces, in which the light-emitting element 12 is mounted on the bottom surface of the recessed portion. The light-emitting element 12 has a pair of positive and negative electrodes, and the positive and negative electrodes each are electrically connected to the first lead 51 and the second lead 52 via a wire that is a conductive member 63. The light-emitting element 12 is covered with the wavelength conversion member 34 composed of a fluorescent material layer. The wavelength conversion member 34 composed of a fluorescent material layer contains a fluorescent material 21 and a transparent material. The fluorescent material 21 is excited by light emitted from the light-emitting element 12 and emits light. The wavelength conversion member 34 composed of a fluorescent material layer contains at least one fluorescent material 21 that is excited by light emitted from the light-emitting element 12 to emit light, and that emits light having a dominant wavelength in a range of 584 nm or more and 780 nm or less; and may contain two or more fluorescent materials having different light emission peak wavelength. The first lead 51 and the second lead 52 connected to the pair of positive and negative electrodes of the light-emitting element 12 are partly exposed to the outside of the molded body 41. The light-emitting device 200 is able to emit light upon receiving electric power supplied from the outside of the light-emitting device 200 via the first lead 51 and the second lead 52. The light-emitting device 200 emits light having a dominant wavelength in a range of 584 nm or more and 780 nm or less. The light-emitting device 200 emits light exhibiting the light emission color within the above-mentioned area Ar in the x-y chromaticity coordinate system of the CIE 1931 chromaticity diagram. The light-emitting device 200 may emit light having a dominant wavelength in a range of 600 nm or more and 780 nm or less. The light-emitting device 200 may emit light exhibiting the light emission color within the above-mentioned area A-1 in the x-y chromaticity coordinate system of the CIE 1931 chromaticity diagram. The light-emitting device 200 may emit light having a dominant wavelength in a range of 610 nm or more and 780 nm or less. The light-emitting device 200 may emit light exhibiting the light emission color within the above-mentioned area A-2 in the x-y chromaticity coordinate system of the CIE 1931 chromaticity diagram.

The wavelength conversion member 34 composed of a fluorescent material layer in the light-emitting device 200 according to the second embodiment contains a fluorescent material 21, a neodymium compound, and a transparent material; and the transparent material is preferably a resin. The fluorescent material 21, the neodymium compound, and the resin contained in the wavelength conversion member 34 composed of a fluorescent material layer in the light-emitting device 200 according to the second embodiment can be the same fluorescent material, the neodymium compound, and the resin described above.

Method for Producing Light-Emitting Device According to Second Embodiment

An example of the method for producing a light-emitting device according to the second embodiment will be described. For the details, for example, the disclosure of Japanese Unexamined Patent Publication No. 2010-062272 may be referred to. The method for producing a light-emitting device preferably includes a step of preparing a molded body, a step of arranging a light-emitting element, a step of arranging a wavelength conversion member-forming composition, and a step of forming a resin package.

In the step of preparing a molded body, a plurality of leads are integrally molded using a thermosetting resin or a thermoplastic resin to prepare a molded body having a recessed portion with side surfaces and a bottom surface.

In the step of arranging a light-emitting element, a light-emitting element is arranged on the bottom surface of the recessed portion of the molded body, and positive and negative electrodes of the light-emitting element are connected to a first lead and a second lead, respectively, by wires.

In the step of arranging a wavelength conversion member-forming composition, a wavelength conversion member-forming composition is arranged in the recessed portion of the molded body.

In the step of forming a resin package, the wavelength conversion member-forming composition arranged in the recessed portion of the molded body is cured to form a wavelength conversion member composed of a fluorescent material layer, and a resin package is disposed, thereby producing a light-emitting device. Thus, the light-emitting device according to the second embodiment shown in FIG. 2 can be produced.

EXAMPLES

The present invention is hereunder specifically described by reference to the following Examples. The present invention is not limited to these Examples.

Fluorescent Material

For the light-emitting devices in Examples and Comparative Examples, the fluorescent materials used were SCASN-1, SCASN-2, SCASN-3, CASN-1, and CASN-2 shown in Table 1. SCASN-1, SCASN-2, and SCASN-3 had a composition represented by the formula (1) or a composition represented by the formula (1A) each containing Sr in the composition, and were obtained by adjusting the molar ratio of the elements (for example, Sr and Eu) contained in the composition and the production conditions to change the light emission peak wavelength, particle diameter, and other light emission characteristics. CASN-1 and CASN-2 had a composition represented by the formula (1) or a composition represented by the formula (1A) each not containing Sr in the composition, and were obtained by adjusting the molar ratio of the element (for example, Eu) contained in the composition and the production conditions to change the light emission peak wavelength, particle diameter, and other light emission characteristics. The methods for evaluating the fluorescent materials shown in Table 1 are described below.

Average Particle Diameter

The average particle diameter of each fluorescent material was measured by the FSSS method using a Fisher Sub-Sieve Sizer Model 95 (manufactured by Fisher Scientific Inc.). Specifically, a sample having a volume of 1 cm$^3$ was weighed and packed in a dedicated tubular container, followed by flowing dry air at a constant pressure, and the specific surface area was read from the differential pressure and converted into the average particle diameter (Fisher Sub-Sieve Sizer's No.).

Light Emission Characteristics

Figure 3:
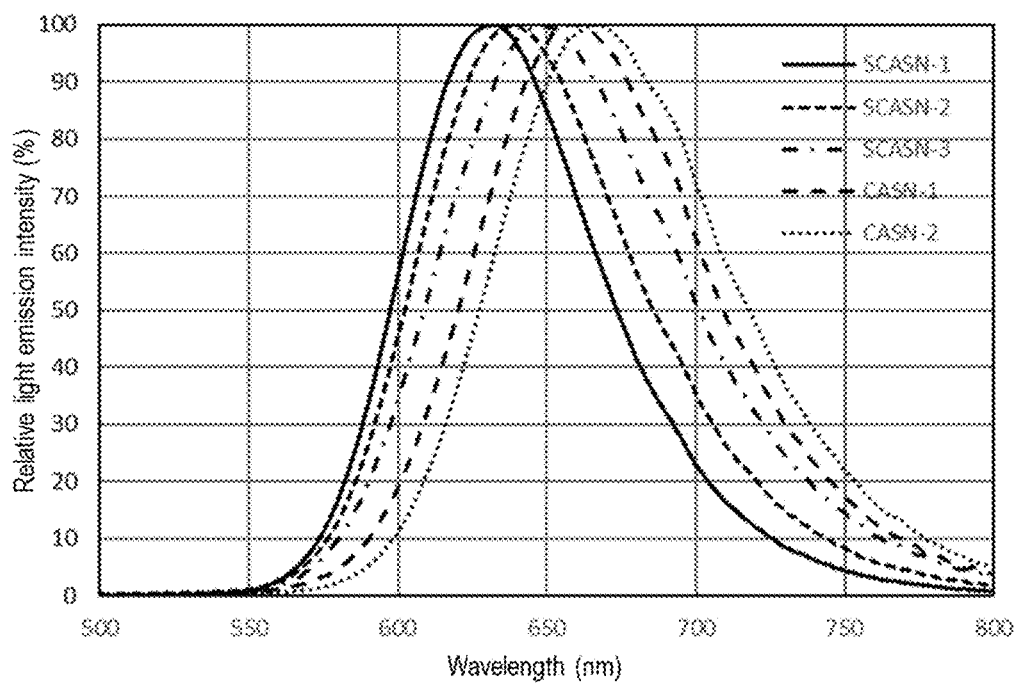
FIG. 3 is a graph showing the light emission spectrum of each fluorescent material used in the light-emitting device.

The light emission characteristics of each fluorescent material were measured. As to the light emission characteristics of each fluorescent material, using a quantum efficiency measurement apparatus (product name: QE-2000, manufactured by Otsuka Electronics Co., Ltd.), each fluorescent material was irradiated with excitation light having a wavelength of 450 nm to measure the light emission spectrum at room temperature (25° C.±5° C.). From the obtained light emission spectrum of each fluorescent material, the chromaticity coordinates ($x_p$, $y_p$) in the chromaticity coordinate system of the CIE 1931 chromaticity diagram, the peak wavelength λp, and the half value width of the light emission spectrum were determined. FIG. 3 shows a light emission spectrum of each fluorescent material.

Reflection Spectrum

For each fluorescent material, the reflection spectrum in the wavelength range of 380 nm or more and 780 nm or less was measured by irradiating each fluorescent material serving as a sample with light from an excitation light source (xenon lamp) using a spectrophotometer (product name: F-4500, manufactured by Hitachi High-Technologies Corp.) at room temperature (25° C.±5° C.). Calcium hydrogen phosphate (CaHPO$_4$) was used as a reference sample. The reflectance at 450 nm was determined as the relative reflectance, with reference to the reflectance of calcium hydrogen phosphate to excitation light having an excitation wavelength of 450 nm.

Neodymium Compound

Figure 4:
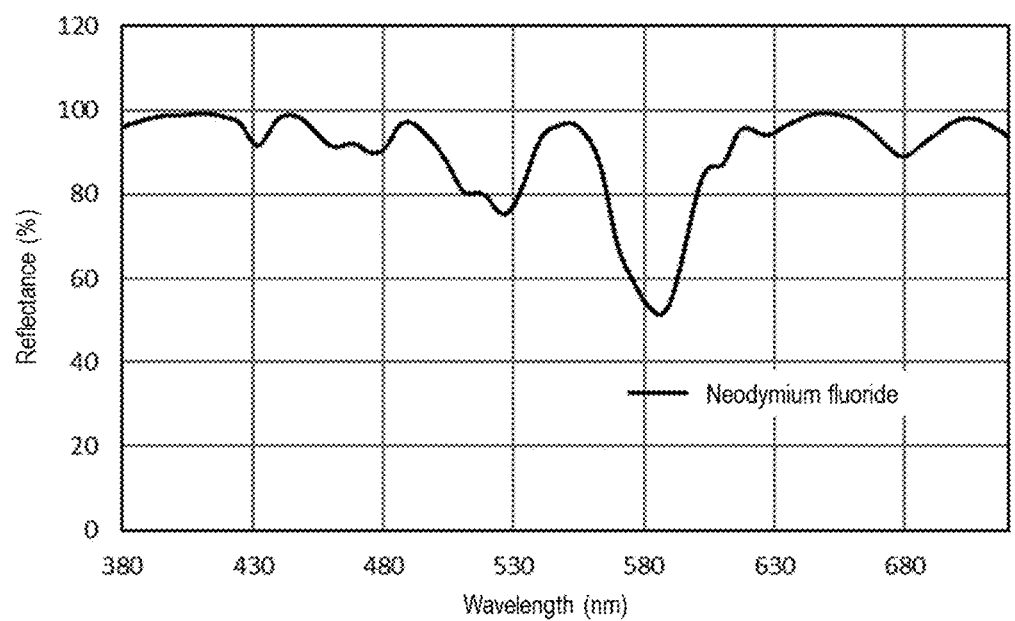
FIG. 4 is a graph showing the reflection spectrum of neodymium fluoride.

Neodymium fluoride (NdF$_3$) having a central particle diameter of 0.172 μm was used as the neodymium compound. Here, the central particle diameter of the neodymium fluoride refers to a volume average particle diameter (median diameter), and is a particle diameter (D50: median diameter) at which the volume cumulative frequency from the small diameter side reaches 50%. The central particle diameter of the neodymium fluoride was measured using a laser diffraction particle size distribution measuring apparatus (product name: Mastersizer 2000, manufactured by Malvern Panalytical Ltd.). In addition, the reflection spectrum of the neodymium fluoride was measured using the same apparatus as that for measuring the reflection spectrum of the fluorescent material. The wavelength Wr of the neodymium fluoride representing the minimum reflection intensity in the wavelength range of 380 nm or more and 780 nm or less was 586 nm. The reflection spectrum of the neodymium fluoride is shown in FIG. 4.

TABLE 1

| Fluorescent material | Average particle diameter (μm) | Chromaticity coordinates $x_D$ | Chromaticity coordinates $y_D$ | Peak wavelength λp (nm) | Reflectance at 450 nm {%} | Half value width (nm) |
|---|---|---|---|---|---|---|
| SCASN-1 | 19.2 | 0.658 | 0.342 | 633 | 5.7 | 77 |
| SCASN-2 | 21.5 | 0.665 | 0.335 | 639 | 5.0 | 84 |
| SCASN-3 | 18.7 | 0.670 | 0.330 | 648 | 6.3 | 92 |
| CASN-1 | 18.1 | 0.683 | 0.317 | 658 | 7.9 | 89 |
| CASN-2 | 19.1 | 0.690 | 0.310 | 665 | 6.6 | 91 |

Example 1

The light-emitting device 100 according to the first embodiment shown in FIGS. 1A and 1B was produced.

First Step

A light-emitting element 11 was arranged on a substrate 71.

The light-emitting element 11 used in the light-emitting device 100 was formed by laminating a semiconductor layer on a sapphire substrate; and had a substantially square shape having a thickness of approximately 0.1 mm and a planar shape of approximately 1.0 mm square, and a dominant wavelength λe of 450 nm. The dominant wavelength λe of the light-emitting element was obtained by measuring the light emission spectrum at room temperature (25° C.±5° C.) using an optical measurement system combining a multi-channel spectrometer and an integrating sphere, and determining the chromaticity coordinates ($x_E$, $y_E$) in the chromaticity coordinate system of the CIE 1931 chromaticity diagram from the measured light emission spectrum of the light-emitting element.

Bumps made of gold (Au) were provided in advance as conductive members 61 on a conductive pattern provided on the substrate 71. The light-emitting element 11 and a semiconductor element 13 were arranged on the substrate 71 via the bumps so as to be in a row, and flip-chip mounted by the bumps. The light-emitting element 11 was arranged such that the sapphire substrate side was the light-emitting surface from which light was emitted.

Second Step

A fluorescent material layer 31 was disposed on a transparent body 32 to produce a wavelength conversion member 33 in which the transparent body 32 and the fluorescent material layer 31 were integrated. A plate-shaped borosilicate glass having a thickness of approximately 0.10 mm was used as the material of the transparent body 32. A SCASN-1 fluorescent material was used as the fluorescent material. A silicone resin was used as the binder. A fluorescent material layer-forming composition contained a silicone resin, a SCASN-1 fluorescent material, and a neodymium compound; and contained 190 parts by mass of the SCASN-1 fluorescent material and 50 parts by mass of the neodymium compound relative to 100 parts by mass of the silicone resin. Neodymium fluoride ($NdF_3$) was used as the neodymium compound. The content of the neodymium compound in the fluorescent material layer-forming composition was 26.3 parts by mass relative to 100 parts by mass of the SCASN-1 fluorescent material. The fluorescent material layer-forming composition was coated on one main surface of the transparent body 32, and the silicone resin was cured to form a fluorescent material layer 31 having a thickness of 80 μm. The transparent body 32 on which the fluorescent material layer 31 was disposed was then cut to produce a wavelength conversion member 33, in which the transparent body 32 and the fluorescent material layer 31 were integrated, having a substantially square shape in which the thickness of the transparent body 32 was approximately 0.10 mm, the thickness of the fluorescent material layer 31 was 80 μm, and the planar shape was approximately 1.15 mm square. Here, the wavelength conversion member 33 may be produced by forming the fluorescent material layer 31 after cutting the transparent body 32 to a desired size, and may be produced by forming the fluorescent material layer 31 and then cutting the transparent body 32 and the fluorescent material layer 31 to a desired size and shape.

Third Step

The fluorescent material layer 31 was opposed to the light-emitting surface of the light-emitting element 11, and the wavelength conversion member 33 was bonded onto the light-emitting element 11 with an adhesive layer 81. A silicone resin was used as the adhesive for forming the adhesive layer 81. Since the planar shape of the fluorescent material layer 31 in the wavelength conversion member 33 was approximately 0.15 mm larger in length and width than the light-emitting surface of the light-emitting element 11, the bonding surface of the fluorescent material layer 31 protruded from the light-emitting surface of the light-emitting element 11 in the bonding surface between the fluorescent material layer 31 and the light-emitting element 11, and the adhesive adhered at the area from the protruded area to the side surface of the light-emitting element 11 to form an adhesive layer provided with a protruding portion having a substantially triangular cross-sectional shape.

Fourth Step

The side surface of the wavelength conversion member 33 excluding the light-emitting surface was covered with a covering member composition, and the covering member composition was cured to form a covering member 91, thereby producing the light-emitting device 100. Specifically, a covering member composition was filled around the light-emitting element 11, the fluorescent material layer 31, and the transparent body 32, excluding the light-emitting surface of the transparent body 32, and also filled around the semiconductor element 13 so as to completely embed the semiconductor element 13, thereby forming a covering member 91. The covering member composition contained a resin and a light reflecting material. A dimethyl silicone resin was used as the resin, and titanium oxide particles having an average particle diameter of 0.28 μm were used as the light reflecting material. Here, the average particle diameter of the titanium oxide particles is a catalog value and is an average particle diameter measured by the FSSS method. The blending amount of the light reflecting material in the covering member composition was 60 parts by mass relative to 100 parts by mass of the resin.

Example 2

The light-emitting device 100 was produced in the same manner as in Example 1 except that a SCASN-3 fluorescent material was used, and the fluorescent material layer 31 was prepared using a fluorescent material layer-forming composition containing 190 parts by mass of the SCASN-3 fluorescent material relative to 100 parts by mass of the silicone resin.

Example 3

The light-emitting device 100 was produced in the same manner as in Example 1 except that a CASN-1 fluorescent material was used, and the fluorescent material layer 31 was prepared using a fluorescent material layer-forming composition containing 210 parts by mass of the CASN-1 fluorescent material and 50 parts by mass of the neodymium compound relative to 100 parts by mass of the silicone resin. The content of the neodymium compound in the fluorescent material layer-forming composition was 23.8 parts by mass relative to 100 parts by mass of the CASN-1 fluorescent material.

Comparative Example 1

The light-emitting device 100 was produced in the same manner as in Example 1 except that the fluorescent material layer 31 was prepared using a fluorescent material layer-forming composition containing no neodymium compound.

Comparative Example 2

The light-emitting device 100 was produced in the same manner as in Example 1 except that a SCASN-1 fluorescent material and a SCASN-2 fluorescent material were used, and the fluorescent material layer 31 was prepared using a fluorescent material layer-forming composition containing 190 parts by mass of the SCASN-1 fluorescent material and the SCASN-2 fluorescent material in a total amount relative to 100 parts by mass of the silicone resin, and containing no neodymium compound. The mass ratio of the SCASN-1 fluorescent material and the SCASN-2 fluorescent material in the fluorescent material layer-forming composition and the fluorescent material layer 31 was 50:50 relative to a total amount of 100.

Comparative Example 3

The light-emitting device 100 was produced in the same manner as in Example 1 except that a SCASN-2 fluorescent material was used, and the fluorescent material layer 31 was prepared using a fluorescent material layer-forming composition containing 190 parts by mass of the SCASN-2 fluorescent material relative to 100 parts by mass of the silicone resin, and containing no neodymium compound.

Comparative Example 4

The light-emitting device 100 was produced in the same manner as in Example 1 except that a SCASN-2 fluorescent material and a SCASN-3 fluorescent material were used, and the fluorescent material layer 31 was prepared using a fluorescent material layer-forming composition containing 190 parts by mass of the SCASN-2 fluorescent material and the SCASN-3 fluorescent material in a total amount relative to 100 parts by mass of the silicone resin, and containing no neodymium compound. The mass ratio of the SCASN-2 fluorescent material and the SCASN-3 fluorescent material in the fluorescent material layer-forming composition and the fluorescent material layer 31 was 50:50 relative to a total amount of 100.

Comparative Example 5

The light-emitting device 100 was produced in the same manner as in Example 1 except that a SCASN-3 fluorescent material was used, and the fluorescent material layer 31 was prepared using a fluorescent material layer-forming composition containing 190 parts by mass of the SCASN-3 fluorescent material relative to 100 parts by mass of the silicone resin, and containing no neodymium compound.

Comparative Example 6

The light-emitting device 100 was produced in the same manner as in Example 1 except that a SCASN-3 fluorescent material and a CASN-1 fluorescent material were used, and the fluorescent material layer 31 was prepared using a fluorescent material layer-forming composition containing 190 parts by mass of the SCASN-3 fluorescent material and the CASN-1 fluorescent material in a total amount relative to 100 parts by mass of the silicone resin, and containing no neodymium compound. The mass ratio of the SCASN-3 fluorescent material and the CASN-1 fluorescent material in the fluorescent material layer-forming composition and the fluorescent material layer 31 was 50:50 relative to a total amount of 100.

Comparative Example 7

The light-emitting device 100 was produced in the same manner as in Example 1 except that a CASN-1 fluorescent material was used, and the fluorescent material layer 31 was prepared using a fluorescent material layer-forming composition containing 210 parts by mass of the CASN-1 fluorescent material relative to 100 parts by mass of the silicone resin, and containing no neodymium compound.

Comparative Example 8

The light-emitting device 100 was produced in the same manner as in Example 1 except that a CASN-1 fluorescent material and a CASN-2 fluorescent material were used, and the fluorescent material layer 31 was prepared using a fluorescent material layer-forming composition containing 218 parts by mass of the CASN-1 fluorescent material and the CASN-2 fluorescent material in a total amount relative to 100 parts by mass of the silicone resin, and containing no neodymium compound. The mass ratio of the CASN-1 fluorescent material and the CASN-2 fluorescent material in the fluorescent material layer-forming composition and the fluorescent material layer 31 was 20:80 relative to a total amount of 100.

Comparative Example 9

The light-emitting device 100 was produced in the same manner as in Example 1 except that a CASN-2 fluorescent material was used, and the fluorescent material layer 31 was prepared using a fluorescent material layer-forming composition containing 220 parts by mass of the CASN-2 fluorescent material relative to 100 parts by mass of the silicone resin, and containing no neodymium compound.

The fluorescent material used in the light-emitting device in each of Examples and Comparative Examples, the contents of the fluorescent material and the neodymium compound relative to 100 parts by mass of the resin in the fluorescent material layer-forming composition, and the content of the neodymium compound relative to 100 parts by mass of the fluorescent material are shown in Tables 2 and 3.

Evaluations of Light-Emitting Device

The light-emitting device in each of Examples and Comparative Examples was evaluated as follows. The following evaluations were measured by applying a current of 350 mA to the light-emitting device.

Chromaticity Coordinates ($x_D$, $y_D$), Dominant Wavelength λd, and Half Value Width of Light Emission Spectrum For each light-emitting device, the light emission spectrum was measured using an optical measurement system combining a multichannel spectrometer and an integrating sphere to determine the chromaticity coordinates ($x_D$, $y_D$) in the chromaticity coordinate system of the CIE 1931 chromaticity diagram, the dominant wavelength λd, and the half value width. The dominant wavelength λd of the light-emitting device was a wavelength of the point where the chromaticity coordinates (x=0.3333, y=0.3333) of white light and the chromaticity coordinates ($x_D$, $y_D$) of the light emission color of the light-emitting device were connected by a straight line in the chromaticity coordinate system of the CIE 1931 chromaticity diagram, and the extension line thereof and the spectrum locus intersected. The results are shown in Table 2.

FIG. 5 is a diagram showing the area Ar, and plotting the chromaticity coordinates ($x_D$, $y_D$) of the light emission color of the light-emitting device in each of Examples 1 to 3 and Comparative Examples 1 to 9 in the x-y chromaticity coordinate system of the CIE 1931 chromaticity diagram, in which, when the chromaticity coordinates (x=0.520, y=0.450) is defined as a first point, the chromaticity coordinates (x=0.538, y=0.461) is defined as a second point, the chromaticity coordinates (x=0.735, y=0.265) is defined as a third point, and the chromaticity coordinates (x=0.715, y=0.259) is defined as a fourth point, the area Ar is demarcated by a first straight line connecting the first point and the second point, a second straight line connecting the second point and the third point, a third straight line connecting the third point and the fourth point, and a fourth straight line connecting the fourth point and the first point.

FIG. 6 is a diagram showing the area A-1, and plotting the chromaticity coordinates ($x_D$, $y_D$) of the light emission color of the light-emitting device in each of Examples 1 to 3 and Comparative Examples 1 to 9 in the x-y chromaticity coordinate system of the CIE 1931 chromaticity diagram, in which, when the chromaticity coordinates (x=0.600, y=0.372) is defined as a first-one (1-1) point, the chromaticity coordinates (x=0.627, y=0.372) is defined as a second-one (2-1) point, the chromaticity coordinates (x=0.735, y=0.265) is defined as a third point, and the chromaticity coordinates (x=0.715, y=0.259) is defined as a fourth point, the area A-1 is demarcated by a first-one (1-1) straight line connecting the first-one (1-1) point and the second-one (2-1) point, a second-one (2-1) straight line connecting the second-one (2-1) point and the third point, a third straight line connecting the third point and the fourth point, and a fourth-one (4-1) straight line connecting the fourth point and the first-one (1-1) point.

FIG. 7 is a diagram showing the area A-2, and plotting the chromaticity coordinates ($x_D$, $y_D$) of the light emission color of the light-emitting device in each of Examples 1 to 3 and Comparative Examples 1 to 9 in the x-y chromaticity coordinate system of the CIE 1931 chromaticity diagram, in which, when the chromaticity coordinates (x=0.640, y=0.335) is defined as a first-two (1-2) point, the chromaticity coordinates (x=0.665, y=0.335) is defined as a second-two (2-2) point, the chromaticity coordinates (x=0.735, y=0.265) is defined as a third point, and the chromaticity coordinates (x=0.715, y=0.259) is defined as a fourth point, the area A-2 is demarcated by a first-two (1-2) straight line connecting the first-two (1-2) point and the second-two (2-2) point, a second-two (2-2) straight line connecting the second-two (2-2) point and the third point, a third straight line connecting the third point and the fourth point, and a fourth-two (4-2) straight line connecting the fourth point and the first-two (1-2) point.

Figure 8:
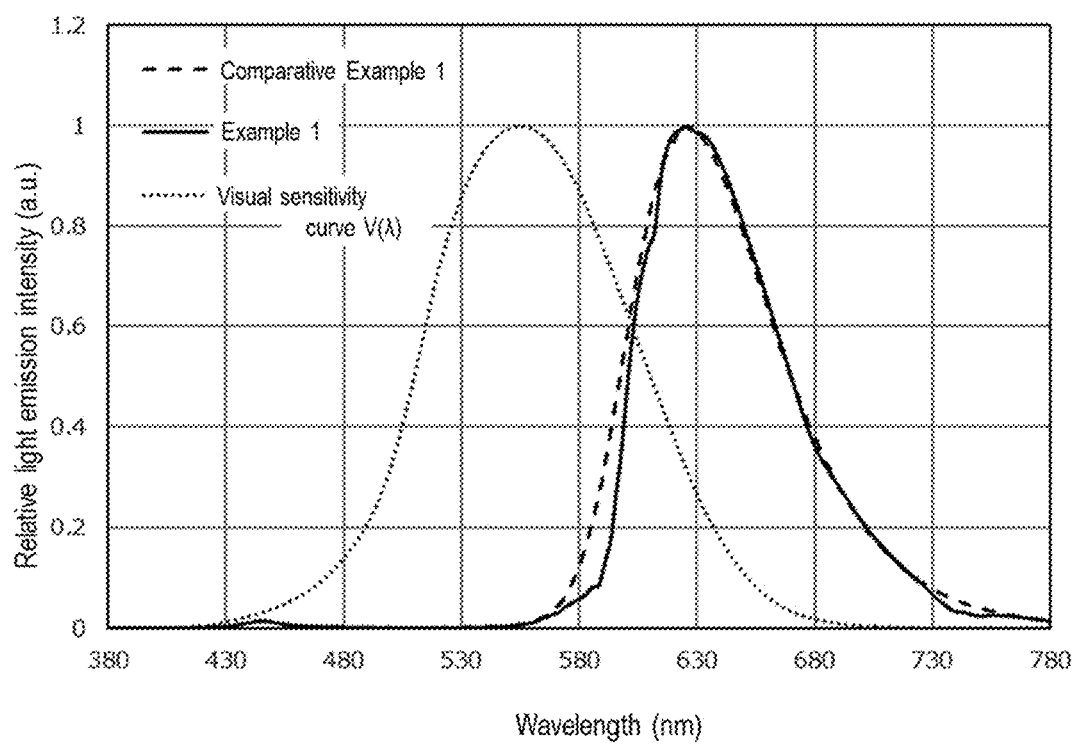
FIG. 8 is a graph showing the light emission spectrum of the light-emitting device according to Example 1, the light emission spectrum of the light-emitting device according to Comparative Example 1, and the visual sensitivity curve of humans.

FIG. 8 shows the relative light emission spectrum of the light-emitting device according to Example 1 containing the SCASN-1 fluorescent material when the maximum light emitting intensity was 1, the relative light emission spectrum of the light-emitting device according to Comparative Example 1 containing the SCASN-1 fluorescent material when the maximum light emitting intensity was 1, and the visual sensitivity curve of humans.

Figure 9:
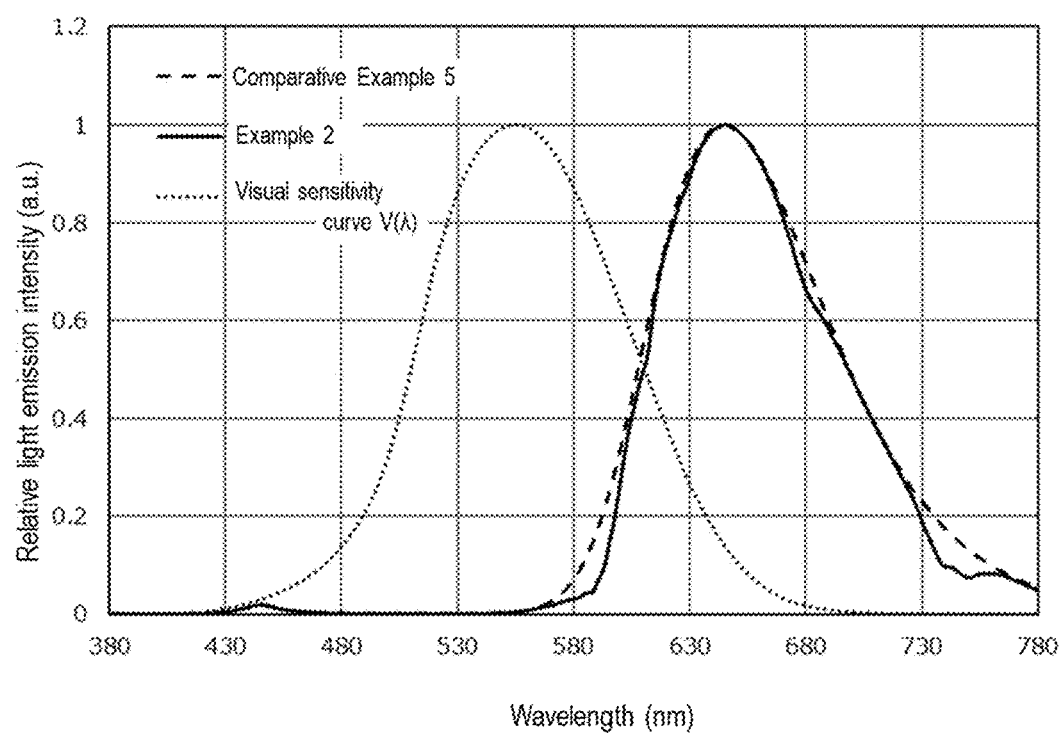
FIG. 9 is a graph showing the light emission spectrum of the light-emitting device according to Example 2, the light emission spectrum of the light-emitting device according to Comparative Example 5, and the visual sensitivity curve of humans.

FIG. 9 shows the relative light emission spectrum of the light-emitting device according to Example 2 containing the SCASN-3 fluorescent material when the maximum light emitting intensity was 1, the relative light emission spectrum of the light-emitting device according to Comparative Example 5 containing the SCASN-3 fluorescent material when the maximum light emitting intensity was 1, and the visual sensitivity curve of humans.

Figure 10:
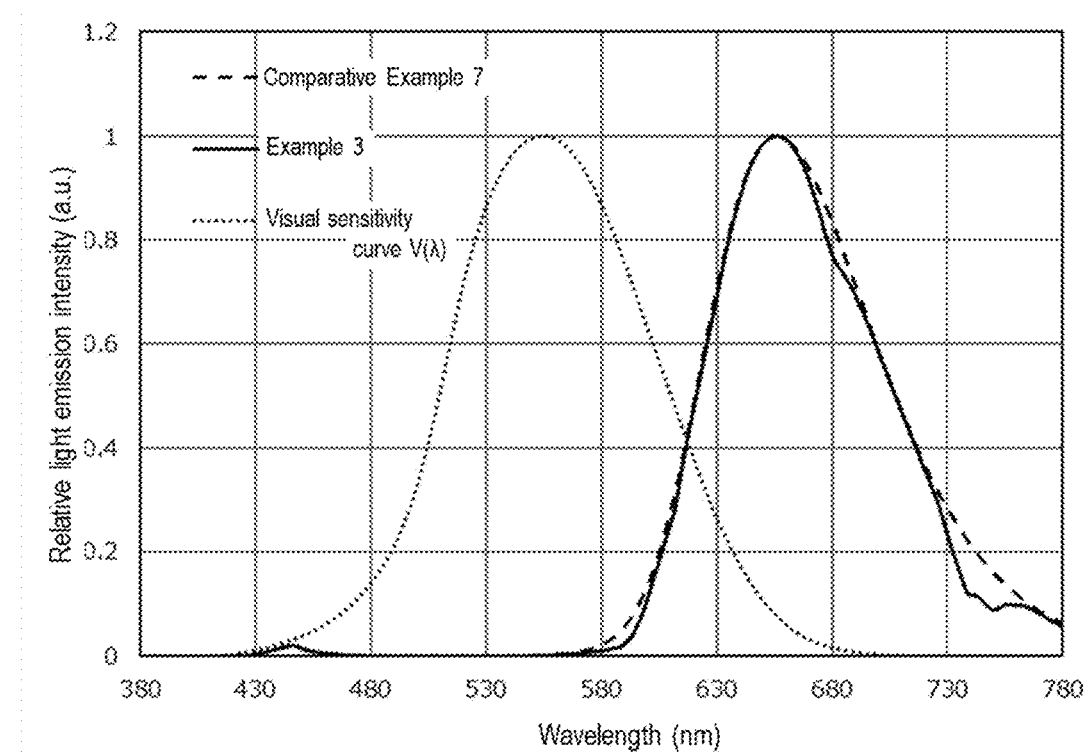
FIG. 10 is a graph showing the light emission spectrum of the light-emitting device according to Example 3, the light emission spectrum of the light-emitting device according to Comparative Example 7, and the visual sensitivity curve of humans.

FIG. 10 shows the relative light emission spectrum of the light-emitting device according to Example 3 containing the CASN-1 fluorescent material when the maximum light emitting intensity was 1, the relative light emission spectrum of the light-emitting device according to Comparative Example 7 containing the CASN-1 fluorescent material when the maximum light emitting intensity was 1, and the visual sensitivity curve of humans.

As shown in FIGS. 5 to 7, the chromaticity coordinates ($x_D$, $y_D$) of the light emission colors of the light-emitting devices in Examples 1 to 3 and Comparative Examples 1 to 9 were all in the area Ar, the area A-1, and the area A-2, which were the target color tone range, and red light was emitted from the light-emitting devices.

As shown in Table 2 and FIG. 8, comparing the light-emitting device according to Example 1 containing the SCASN-1 fluorescent material and the light-emitting device according to Comparative Example 1 containing the SCASN-1 fluorescent material, the light-emitting device according to Example 1 absorbed a part of the light emitted from the SCASN-1 fluorescent material by the neodymium fluoride, and emitted light having a narrower half value width of the light emission spectrum and a dominant wavelength on the longer wavelength side than those of the light-emitting device according to Comparative Example 1.

As shown in Table 2 and FIG. 9, comparing the light-emitting device according to Example 2 containing the SCASN-3 fluorescent material and the light-emitting device according to Comparative Example 5 containing the SCASN-3 fluorescent material, the light-emitting device according to Example 2 absorbed a part of the light emitted from the SCASN-3 fluorescent material by the neodymium fluoride, and emitted light having a narrower half value width of the light emission spectrum and a dominant wavelength on the longer wavelength side than those of the light-emitting device according to Comparative Example 5.

As shown in Table 2 and FIG. 10, comparing the light-emitting device according to Example 3 containing the CASN-1 fluorescent material and the light-emitting device according to Comparative Example 7 containing the CASN-1 fluorescent material, the light-emitting device according to Example 3 absorbed a part of the light emitted from the CASN-1 fluorescent material by the neodymium fluoride, and emitted light having a narrower half value width of the light emission spectrum and a dominant wave-

TABLE 2

| | Fluorescent material | Fluorescent material Content (parts by mass) | $NdF_3$ Content (parts by mass) | $NdF_3$/ fluorescent material (% by mass) | Chromaticity coordinates | | Dominant wavelength λd (nm) | Half value width (nm) |
|---|---|---|---|---|---|---|---|---|
| | | | | | $x_D$ | $y_D$ | | |
| Example 1 | SCASN-1 | 190 | 50 | 26.3 | 0.668 | 0.321 | 614 | 69 |
| Example 2 | SCASN-3 | 190 | 50 | 26.3 | 0.674 | 0.308 | 621 | 88 |
| Example 3 | CASN-1 | 210 | 50 | 23.8 | 0.680 | 0.295 | 630 | 86 |
| Comparative Example 1 | SCASN-1 | 190 | — | — | 0.657 | 0.333 | 610 | 73 |
| Comparative Example 2 | SCASN-1 + SCASN-2 | 190 | — | — | 0.659 | 0.330 | 611 | 77 |
| Comparative Example 3 | SCASN-2 | 190 | — | — | 0.660 | 0.326 | 613 | 82 |
| Comparative Example 4 | SCASN-2 + SCASN-3 | 190 | — | — | 0.663 | 0.322 | 614 | 88 |
| Comparative Example 5 | SCASN-3 | 190 | — | — | 0.667 | 0.318 | 616 | 91 |
| Comparative Example 6 | SCASN-3 + CASN-1 | 190 | — | — | 0.673 | 0.308 | 621 | 89 |
| Comparative Example 7 | CASN-1 | 210 | — | — | 0.678 | 0.300 | 626 | 86 |
| Comparative Example 8 | CASN-1 + CASN2 | 218 | — | — | 0.686 | 0.294 | 630 | 87 |
| Comparative Example 9 | CASN-2 | 220 | — | — | 0.689 | 0.292 | 632 | 87 | length on the longer wavelength side than those of the light-emitting device according to Comparative Example 7.

The light-emitting devices according to Comparative Examples 2 to 4, 6, 8, and 9 were produced to confirm the relationship between the change in the dominant wavelength of the light-emitting devices according to Examples 1 to 3 and the luminous flux, since the dominant wavelength of the light-emitting devices according to Examples 1 to 3 changed to the long wavelength side. As the dominant wavelength changed to the long wavelength side, the luminous flux decreased because the distance from the visual sensitivity curve of humans was increased.

Relative Luminous Flux

The luminous flux of the light emitting-device according to Example 1 and the luminous flux of the light-emitting device according to Comparative Example 4, each of which had the same dominant wavelength λd, were derived from the light emission spectrum measured using an optical measurement system combining a multichannel spectrometer and an integrating sphere, and the relative luminous flux of the light-emitting device according to Example 1 was determined by setting the luminous flux of the light-emitting device according to Comparative Example 4 to 100%.

The luminous flux of the light emitting-device according to Example 2 and the luminous flux of the light-emitting device according to Comparative Example 6, each of which had the same dominant wavelength λd, were derived from the light emission spectrum measured using an optical measurement system combining a multichannel spectrometer and an integrating sphere, and the relative luminous flux of the light-emitting device according to Example 2 was determined by setting the luminous flux of the light-emitting device according to Comparative Example 6 to 100%.

The luminous flux of the light emitting-device according to Example 3 and the luminous flux of the light-emitting device according to Comparative Example 8, each of which had the same dominant wavelength λd, were derived from the light emission spectrum measured using an optical measurement system combining a multichannel spectrometer and an integrating sphere, and the relative luminous flux of the light-emitting device according to Example 3 was determined by setting the luminous flux of the light-emitting device according to Comparative Example 8 to 100%. The results are shown in Table 3.

Figure 11:
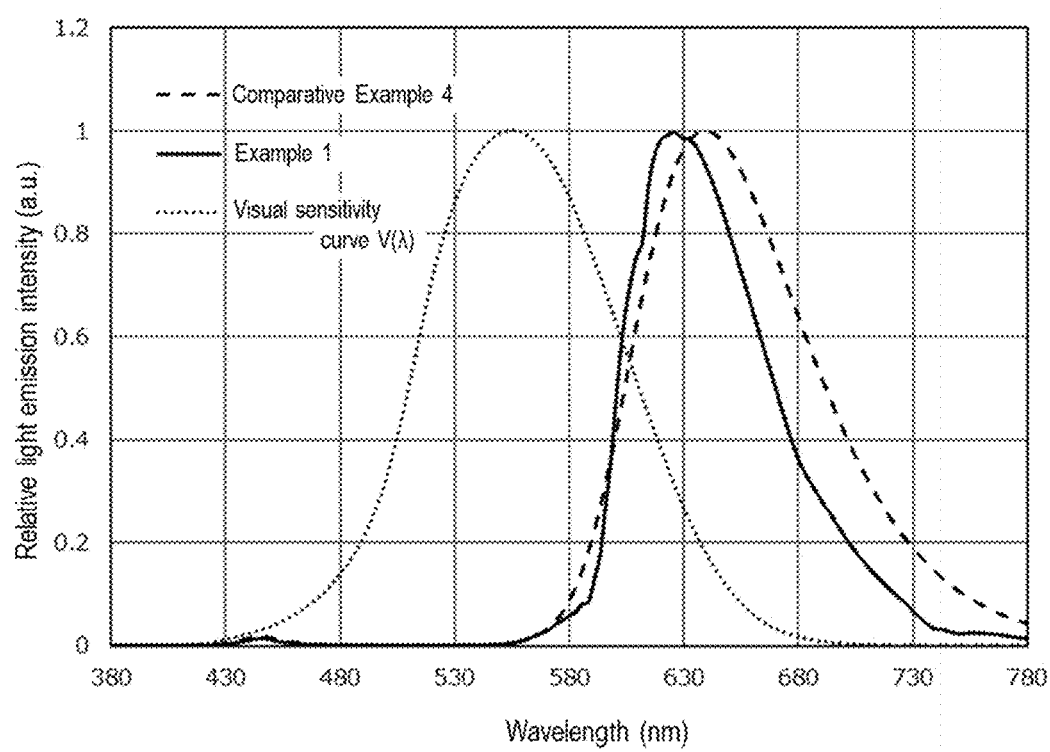
FIG. 11 is a graph showing the light emission spectrum of the light-emitting device according to Example 1, the light emission spectrum of the light-emitting device according to Comparative Example 4, and the visual sensitivity curve of humans.

FIG. 11 shows the relative light emission spectrum of the light-emitting device according to Example 1 when the maximum light emitting intensity was 1, the relative light emission spectrum of the light-emitting device according to Comparative Example 4 when the maximum light emitting intensity was 1, each of which had the same dominant wavelength λd at 614 nm, and the visual sensitivity curve of humans.

Figure 12:
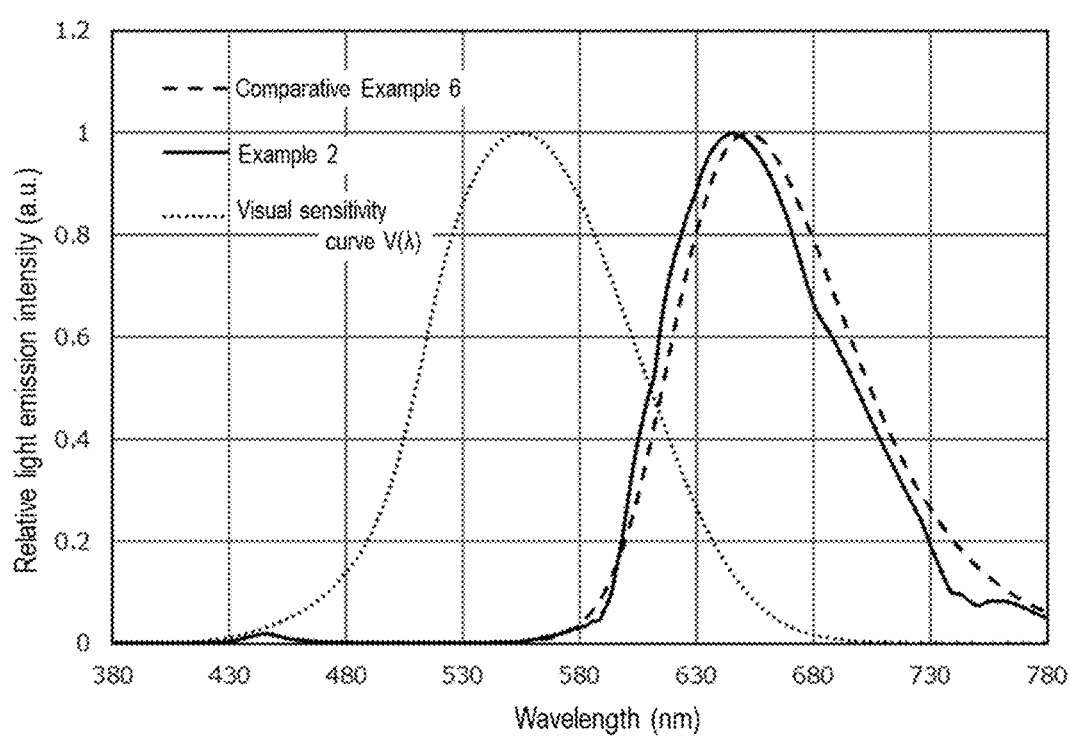
FIG. 12 is a graph showing the light emission spectrum of the light-emitting device according to Example 2, the light emission spectrum of the light-emitting device according to Comparative Example 6, and the visual sensitivity curve of humans.

FIG. 12 shows the relative light emission spectrum of the light-emitting device according to Example 2 when the maximum light emitting intensity was 1, the relative light emission spectrum of the light-emitting device according to Comparative Example 6 when the maximum light emitting intensity was 1, each of which had the same dominant wavelength λd at 621 nm, and the visual sensitivity curve of humans.

Figure 13:
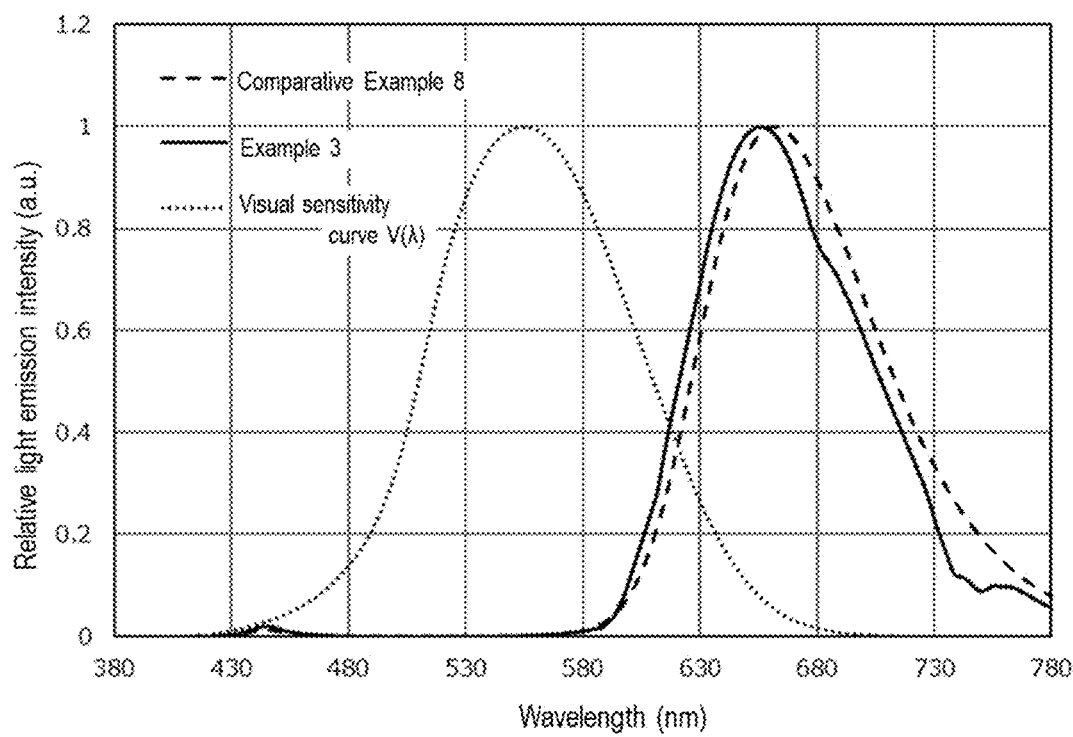
FIG. 13 is a graph showing the light emission spectrum of the light-emitting device according to Example 3, the light emission spectrum of the light-emitting device according to Comparative Example 8, and the visual sensitivity curve of humans.

FIG. 13 shows the relative light emission spectrum of the light-emitting device according to Example 3 when the maximum light emitting intensity was 1, the relative light emission spectrum of the light-emitting device according to Comparative Example 8 when the maximum light emitting intensity was 1, each of which had the same dominant wavelength λd at 630 nm, and the visual sensitivity curve of humans.

TABLE 3

| | Fluorescent material used | Fluorescent material Content (parts by mass) | $NdF_3$ Content (parts by mass) | $NdF_3$/ fluorescent material (% by mass) | Restive luminous flux (%) | Chromaticity coordinates $x_D$ | $y_D$ | Dominant wavelength λd (nm) | Half value width (nm) |
|---|---|---|---|---|---|---|---|---|---|
| Example 1 | SCASN-1 | 190 | 50 | 26.3 | 110.0 | 0.668 | 0.321 | 614 | 69 |
| Comparative Example 4 | SCASN-2 + SCASN-3 | 190 | — | — | 100.0 | 0.663 | 0.322 | 614 | 88 |
| Example 2 | SCASN-3 | 190 | 50 | 26.3 | 109.8 | 0.674 | 0.308 | 621 | 88 |
| Comparative Example 6 | SCASN-3 + CASN-1 | 190 | — | — | 100.0 | 0.673 | 0.308 | 621 | 89 |
| Example 3 | CASN-1 | 210 | 50 | 23.8 | 103.5 | 0.680 | 0.295 | 630 | 86 |
| Comparative Example 8 | CASN-1 + CASN2 | 218 | — | — | 100.0 | 0.686 | 0.294 | 630 | 87 |

As shown in Table 3, comparing the light-emitting device according to Example 1 and the light-emitting device according to Comparative Example 4, each of which had the same dominant wavelength λd, the light-emitting device according to Example 1 had a narrower half value width of the light emission spectrum and a higher relative luminous flux due to the absorption of a part of the light emitted from the SCASN-1 fluorescent material by the neodymium fluoride. As shown in FIG. 11, even when the dominant wavelength λd was the same, the light-emitting device according to Example 1 had a narrower half value width of the light emission spectrum due to the absorption of a part of the light emitted from the fluorescent material by the neodymium fluoride, and even when the dominant wavelength was shifted to the long wavelength side, the portion where the visual sensitivity curve of humans and the light emission spectrum of the light-emitting device were overlapped was slightly increased than that of the light emission spectrum of the light-emitting device according to Comparative Example 4, so that the luminous flux was increased.

As shown in Table 3, comparing the light-emitting device according to Example 2 and the light-emitting device according to Comparative Example 6, each of which had the same dominant wavelength λd, the light-emitting device according to Example 2 had a narrower half value width of the light emission spectrum and a higher relative luminous flux due to the absorption of a part of the light emitted from the SCASN-3 fluorescent material by the neodymium fluoride. As shown in FIG. 12, even when the dominant wavelength λd was the same, the light-emitting device according to Example 2 had a narrower half value width of the light emission spectrum due to the absorption of a part of the light emitted from the fluorescent material by the neodymium fluoride, and even when the dominant wavelength was shifted to the long wavelength side, the portion where the visual sensitivity curve of humans and the light emission spectrum of the light-emitting device were overlapped was increased than that of the light emission spectrum of the light-emitting device according to Comparative Example 6, so that the luminous flux was increased.

As shown in Table 3, comparing the light-emitting device according to Example 3 and the light-emitting device according to Comparative Example 8, each of which had the same dominant wavelength λd, the light-emitting device according to Example 3 had a narrower half value width of the light emission spectrum and a higher relative luminous flux due to the absorption of a part of the light emitted from the CASN-3 fluorescent material by the neodymium fluoride. As shown in FIG. 13, even when the dominant wavelength λd was the same, the light-emitting device according to Example 3 had a narrower half value width of the light emission spectrum due to the absorption of a part of the light emitted from the fluorescent material by the neodymium fluoride, and even when the dominant wavelength was shifted to the long wavelength side, the portion where the visual sensitivity curve of humans and the light emission spectrum of the light-emitting device were overlapped was increased than that of the light emission spectrum of the light-emitting device according to Comparative Example 8, so that the luminous flux was increased.

Figure 14:
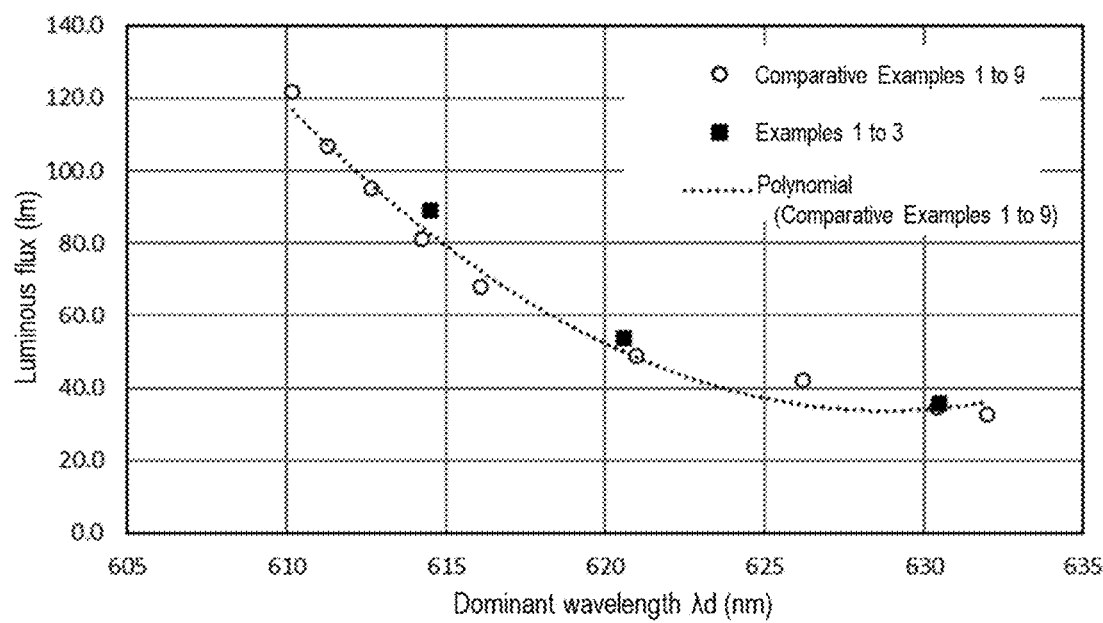
FIG. 14 is a graph showing the relationship between the dominant wavelength λd and the luminous flux of each of the light-emitting devices according to Examples 1 to 3 and Comparative Examples 1 to 9, and the polynomial function of the distribution curve of each of the light-emitting devices according to Comparative Examples 1 to 9.

The light emission spectrum of each of the light-emitting devices according to Examples 1 to 3 and Comparative Examples 1 to 9 was measured using an optical measurement system combining a multichannel spectrometer and an integrating sphere to determine the luminous flux (lm). FIG. 14 shows the relationship between the dominant wavelength and the luminous flux of each light-emitting device; and also shows the distribution of the luminous fluxes to the dominant wavelengths of the light-emitting devices according to Examples 1 to 3, and the distribution of the luminous fluxes to the dominant wavelengths of the light-emitting devices according to Comparative Examples 1 to 9 and the polynomial approximation function that approximated the distribution curve thereof. The polynomial approximation function for the distribution curve of the luminous fluxes to the dominant wavelengths of the light-emitting devices according to Comparative Examples 1 to 9 was determined using the above-mentioned optical measurement system.

As shown in FIG. 14, the luminous flux tended to decrease as the dominant wavelength was at the long wavelength side, but when the dominant wavelengths were the same, the light-emitting devices according to Examples 1 to 3 had a higher luminous flux than that of the light-emitting devices according to Comparative Examples 1 to 9 containing no neodymium compound.

Example 4

The light-emitting device 200 according to the second embodiment shown in FIG. 2 was produced.

A molded body 41 containing a first lead 51, a second lead 52, and a resin having a recessed portion with a bottom surface partially composed of the first lead 51 and the second lead 52, and side surfaces was prepared. As a light-emitting element 12 used in the light-emitting device 200, the same light emitting-element as the light-emitting element 11 used in Example 1 was used. The light-emitting element 12 had a dominant wavelength λe of 450 nm. The light-emitting element 12 was mounted on the bottom surface of the recessed portion, and the first lead 51 and the second lead 52 each were connected to the light-emitting element 12 by a wire that was a conductive member 63. A fluorescent material layer-forming composition containing 80 parts by mass of a SCASN-1 fluorescent material and 5.0 parts by mass of a neodymium compound relative to 100 parts by mass of a silicone resin was prepared. Neodymium fluoride ($NdF_3$) was used as the neodymium compound. The content of the neodymium compound in the fluorescent material layer-forming composition was 6.3 parts by mass relative to 100 parts by mass of the SCASN-1 fluorescent material. The fluorescent material layer-forming composition was filled in the recessed portion of the molded body 41 and heated at 150° C. for 3 hours to cure the fluorescent material layer-forming composition and to form a wavelength conversion member 34 composed of a fluorescent material layer, thereby producing the light-emitting device 200 according to the second embodiment.

Examples 5 to 6

The light-emitting devices 200 according to Examples 5 and 6 were produced in the same manner as in Example 4 except that the amount of the neodymium compound in the fluorescent material layer-forming composition was set to the amount shown in Table 4.

Examples 7 to 9

The light-emitting devices 200 were produced in the same manner as in Example 4 except that a SCASN-3 fluorescent material was used, and the fluorescent material layer-forming composition containing 80 parts by mass of the SCASN-3 fluorescent material relative to 100 parts by mass of the silicone resin, and the neodymium compound in an amount shown in Table 4 was used to form a wavelength conversion member 34 composed of a fluorescent material layer.

Comparative Example 10

The light-emitting device 200 was produced in the same manner as in Example 4 except that the fluorescent material layer-forming composition containing no neodymium compound was used to form a wavelength conversion member 34 composed of a fluorescent material layer.

Comparative Example 11

The light-emitting device 200 was produced in the same manner as in Example 7 except that the fluorescent material layer-forming composition containing no neodymium compound was used to form a wavelength conversion member 34 composed of a fluorescent material layer.

Comparative Example 12

The light-emitting device 200 was produced in the same manner as in Example 7 except that a CASN-2 fluorescent material was used, and the fluorescent material layer-forming composition containing 100 parts by mass of the CASN-2 fluorescent material relative to 100 parts by mass of the silicone resin, and containing no neodymium compound was used to form a wavelength conversion member 34 composed of a fluorescent material layer.

Evaluations of Light-Emitting Device

For the light-emitting devices according to Examples 4 to 9 and Comparative Examples 10 to 12, the chromaticity coordinates ($x_D$, $y_D$), the dominant wavelength λd, the half value width of the light emission spectrum, and the luminous flux (lm) were measured by the above-mentioned method.

FIG. 15 is a diagram showing the area Ar, and plotting the chromaticity coordinates ($x_D$, $y_D$) of the light emission color of the light-emitting device in each of Examples 4 to 9 and Comparative Examples 10 to 12 in the x-y chromaticity coordinate system of the CIE 1931 chromaticity diagram, in which, when the chromaticity coordinates (x=0.520, y=0.450) is defined as a first point, the chromaticity coordinates (x=0.538, y=0.461) is defined as a second point, the chromaticity coordinates (x=0.735, y=0.265) is defined as a third point, and the chromaticity coordinates (x=0.715, y=0.259) is defined as a fourth point, the area Ar is demarcated by a first straight line connecting the first point and the second point, a second straight line connecting the second point and the third point, a third straight line connecting the third point and the fourth point, and a fourth straight line connecting the fourth point and the first point.

FIG. 16 is a diagram showing the area A-1, and plotting the chromaticity coordinates ($x_D$, $y_D$) of the light emission color of the light-emitting device in each of Examples 4 to 9 and Comparative Examples 10 to 12 in the x-y chromaticity coordinate system of the CIE 1931 chromaticity diagram, in which, when the chromaticity coordinates (x=0.600, y=0.372) is defined as a first-one (1-1) point, the chromaticity coordinates (x=0.627, y=0.372) is defined as a second-one (2-1) point, the chromaticity coordinates (x=0.735, y=0.265) is defined as a third point, and the chromaticity coordinates (x=0.715, y=0.259) is defined as a fourth point, the area A-1 is demarcated by a first-one (1-1) straight line connecting the first-one (1-1) point and the second-one (2-1) point, a second-one (2-1) straight line connecting the second-one (2-1) point and the third point, a third straight line connecting the third point and the fourth point, and a fourth-one (4-1) straight line connecting the fourth point and the first-one (1-1) point.

FIG. 17 is a diagram showing the area A-2, and plotting the chromaticity coordinates ($x_D$, $y_D$) of the light emission color of the light-emitting device in each of Examples 4 to 9 and Comparative Examples 10 to 12 in the x-y chromaticity coordinate system of the CIE 1931 chromaticity diagram, in which, when the chromaticity coordinates (x=0.640, y=0.335) is defined as a first-two (1-2) point, the chromaticity coordinates (x=0.665, y=0.335) is defined as a second-two (2-2) point, the chromaticity coordinates (x=0.735, y=0.265) is defined as a third point, and the chromaticity coordinates (x=0.715, y=0.259) is defined as a fourth point, the area A-2 is demarcated by a first-two (1-2) straight line connecting the first-two (1-2) point and the second-two (2-2) point, a second-two (2-2) straight line connecting the second-two (2-2) point and the third point, a third straight line connecting the third point and the fourth point, and a fourth-two (4-2) straight line connecting the fourth point and the first-two (1-2) point.

Figure 18:
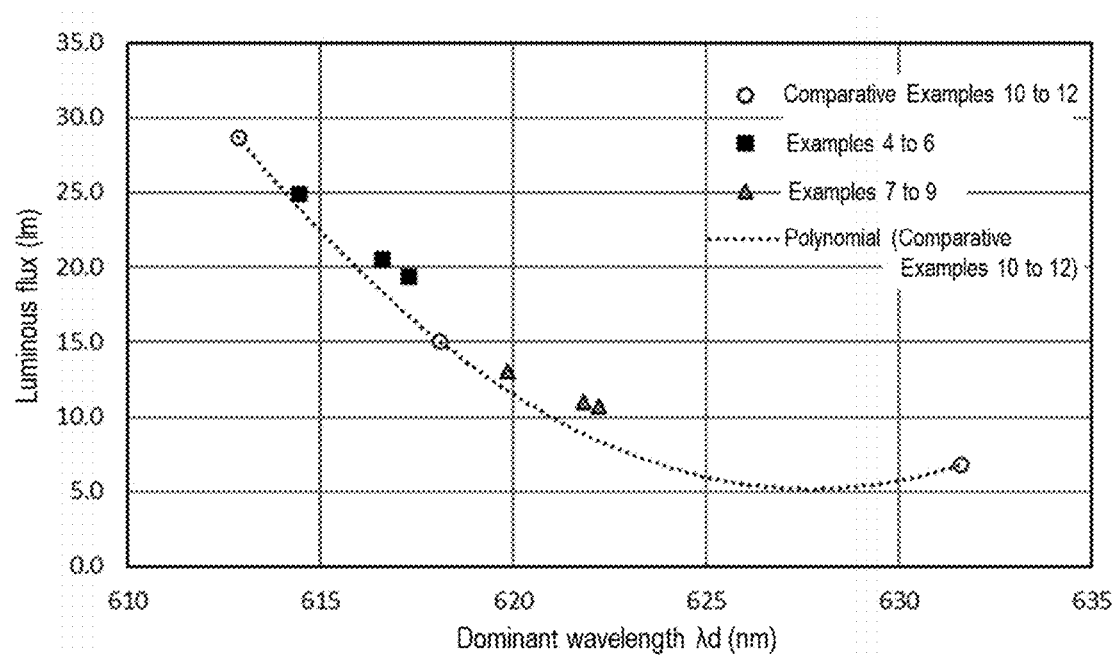
FIG. 18 is a graph showing the relationship between the dominant wavelength $\lambda$d and the luminous flux of each of the light-emitting devices according to Examples 4 to 9 and Comparative Examples 10 to 12, and the polynomial function of the distribution curve of each of the light-emitting devices according to Comparative Examples 10 to 12.

FIG. 18 shows the relationship between the dominant wavelength and the luminous flux of each light-emitting device; and also shows the distribution of the luminous fluxes to the dominant wavelengths of the light-emitting devices according to Examples 4 to 9, and the distribution of the luminous fluxes to the dominant wavelengths of the light-emitting devices according to Comparative Examples 10 to 12 and the polynomial approximation function that approximated the distribution curve thereof. The polynomial approximation function for the distribution curve of the luminous fluxes to the dominant wavelengths of the light-emitting devices according to Comparative Examples 10 to 12 was determined using the above-mentioned optical measurement system.

TABLE 4

|  | Fluorescent material | Fluorescent material Content (parts by mass) | $NdF_3$ Content (parts by mass) | $NdF_3$/ fluorescent material (% by mass) | Chromaticity coordinates $x_D$ | Chromaticity coordinates $y_D$ | Dominant wavelength λd (nm) | Half value width (nm) |
|---|---|---|---|---|---|---|---|---|
| Example 4 | SCASN-1 | 80 | 5.0 | 6.3 | 0.678 | 0.321 | 614 | 68 |
| Example 5 | SCASN-1 | 80 | 15.0 | 18.8 | 0.683 | 0.316 | 617 | 66 |
| Example 6 | SCASN-1 | 80 | 20.0 | 25.0 | 0.685 | 0.314 | 617 | 65 |
| Example 7 | SCASN-3 | 80 | 5.0 | 6.3 | 0.690 | 0.309 | 620 | 85 |
| Example 8 | SCASN-3 | 80 | 15.0 | 18.8 | 0.694 | 0.305 | 622 | 85 |
| Example 9 | SCASN-3 | 80 | 20.0 | 25.0 | 0.695 | 0.304 | 622 | 85 |
| Comparative Example 10 | SCASN-1 | 80 | — | — | 0.673 | 0.325 | 613 | 68 |
| Comparative Example 11 | SCASN-3 | 80 | — | — | 0.686 | 0.313 | 618 | 86 |
| Comparative Example 12 | CASN-2 | 100 | — | — | 0.707 | 0.290 | 632 | 83 |

As shown in Table 4, the light-emitting devices according to Examples 4 to 9 in which the content of the neodymium fluoride was in the range of 5 parts by mass or more and 40 parts by mass or less relative to 100 parts by mass of the fluorescent material had a narrower half value width of the light emission spectrum than that of the light-emitting devices according to Comparative Examples 10 to 12 containing no neodymium fluoride. In the light-emitting devices according to Examples 4 to 9, the dominant wavelength shifted to the long wavelength side as the content of the neodymium fluoride increased, compared with the light-emitting device according to Comparative Example 10 or 11 using the same fluorescent material.

As shown in FIGS. 15 to 17, the chromaticity coordinates ($x_D$, $y_D$) of the light emission colors of the light-emitting devices according to Examples 4 to 9 and Comparative Examples 10 to 12 were all in the area Ar, the area A-1, and the area A-2, which were the target color tone range, and red light was emitted from the light-emitting devices.

As shown in FIG. 18, the luminous flux tended to decrease as the dominant wavelength was at the long wavelength side, but when the dominant wavelengths were the same, the light-emitting devices according to Examples 4 to 9 in which the content of the neodymium compound was in the range of 5 parts by mass or more and 40 parts by mass or less relative to 100 parts by mass of the fluorescent material had a higher luminous flux than that of the light-emitting devices according to Comparative Examples 10 to 12 containing no neodymium compound.

Industrial Applicability

The light-emitting device according to the embodiment of the present invention can be utilized as a light-emitting device for general illumination, a light-emitting device such as a rear lamp or a stop lamp for vehicles, a display device, an illumination fixture, a display, and a light-emitting device such as a backlight source for liquid crystal displays.

EXPLANATIONS OF LETTERS OR NUMERALS

11, 12: Light-emitting element, 13: Semiconductor element, 21: Fluorescent material, 31: Fluorescent material layer, 32: Transparent body, 33, 34: Wavelength conversion member, 41: Molded body, 42: Resin portion, 51: First lead, 52: Second lead, 61, 63: Conductive member, 71: Substrate, 81: Adhesive member, 91: Covering member, 100, 200: Light-emitting device.

The invention claimed is:

1. A light-emitting device, comprising
a light-emitting element that has a dominant wavelength in a range of 380 nm or more and 485 nm or less, and
a fluorescent material layer that comprises a fluorescent material emitting light by being excited by light emitted from the light-emitting element, and a neodymium compound,
the light-emitting device emitting light having a dominant wavelength in a range of 584 nm or more and 780 nm or less, and exhibiting a yellowish-red light emission color to red light emission color,
wherein the light-emitting device has a half value width in a light emission spectrum in a wavelength range of 584 nm or more and 780 nm or less being in a range of 50 nm or more and 100 nm or less,
wherein the fluorescent material comprises at least one nitride fluorescent material selected from the group consisting of a first nitride fluorescent material having a composition represented by the following formula (1), and a second nitride fluorescent material having a composition represented by the following formula (2):

$$(Ca,Sr)AlSiN_3:Eu \tag{1}$$

$$(Ca,Sr,Ba)_2Si_5N_8:Eu \tag{2}$$

wherein the fluorescent material layer has a content of the neodymium compound in a range of 5 parts by mass or more and 40 parts by mass or less relative to 100 parts by mass of the fluorescent material.

2. The light-emitting device according to claim 1, the light-emitting device emits light having a chromaticity within an area of chromaticity coordinates (x, y) in the x-y chromaticity coordinate system of the CIE 1931 chromaticity diagram,
wherein when the chromaticity coordinates (x=0.520, y=0.450) is defined as a first point, the chromaticity coordinates (x=0.538, y=0.461) is defined as a second point, the chromaticity coordinates (x=0.735, y=0.265) is defined as a third point, and the chromaticity coordinates (x=0.715, y=0.259) is defined as a fourth point, the area is demarcated by a first straight line connecting the first point and the second point, a second straight line connecting the second point and the third point, a third straight line connecting the third point and the fourth point, and a fourth straight line connecting the fourth point and the first point.

3. The light-emitting device according to claim 1, wherein the neodymium compound comprises neodymium fluoride.

4. The light-emitting device according to claim 1, wherein the fluorescent material layer comprises a resin, and has a content of the fluorescent material in a range of 100 parts by mass or more and 300 parts by mass or less relative to 100 parts by mass of the resin.

5. The light-emitting device according to claim 1, wherein the light-emitting device has a half value width in a light emission spectrum in a wavelength range of 584 nm or more and 780 nm or less being in a range of 60 nm or more and 95 nm or less.

* * * * *